(12) United States Patent
Okunishi et al.

(10) Patent No.: US 11,495,443 B2
(45) Date of Patent: Nov. 8, 2022

(54) FILTER DEVICE AND PLASMA PROCESSING APPARATUS

(71) Applicant: TOKYO ELECTRON LIMITED, Tokyo (JP)

(72) Inventors: Naohiko Okunishi, Miyagi (JP); Nozomu Nagashima, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 38 days.

(21) Appl. No.: 15/961,001

(22) Filed: Apr. 24, 2018

(65) Prior Publication Data
US 2018/0309423 A1    Oct. 25, 2018

(30) Foreign Application Priority Data

Apr. 25, 2017    (JP) .............................. JP2017-086492

(51) Int. Cl.
*H01J 37/32*      (2006.01)
*C23C 16/458*    (2006.01)
(Continued)

(52) U.S. Cl.
CPC .... *H01J 37/32577* (2013.01); *C23C 16/4585* (2013.01); *H01J 37/32091* (2013.01);
(Continued)

(58) Field of Classification Search
CPC .............. H01L 21/67063; H01L 21/683; H01L 21/6831; H01L 21/6833; H01L 21/68785; H01L 21/68792; H01L 21/67069; H01J 37/32082; H01J 37/32091; H01J 37/32715; H01J 37/32724; H01J 37/321; H01J 37/32174; H01J 37/32183; H01J 37/32577; H01J 37/32706; H01J 37/32458; H01J 37/32532; C23C 14/50; C23C 14/541;
(Continued)

(56) References Cited

U.S. PATENT DOCUMENTS 3,076,947 A *   2/1963  Davidson, Jr. ....... H03H 1/0007
                                                        333/181
4,788,624 A *  11/1988  Strange .................... H01G 4/40
                                                        361/272
(Continued)

FOREIGN PATENT DOCUMENTS

JP          2014-99585 A      5/2014

*Primary Examiner* — Gordon Baldwin
*Assistant Examiner* — Kurt Sweely
(74) *Attorney, Agent, or Firm* — Weihrouch IP

(57) ABSTRACT

Provided is a filter device including a plurality of coils, a plural of capacitors, and a frame. The coils constitute a plurality of coil groups. Each coil group includes two or more coils. The two or more coils in each coil group are provided such that respective windings of the two or more coils extend spirally about a central axis and respective turns of the two or more coils are sequentially and repeatedly arranged in an axial direction in which the central axis extends. The coil groups are provided coaxially with the central axis. A pitch between the respective turns of the two or more coils of any one coil group among the coil groups is larger than a pitch between the respective turns of the two or more coils of the coil group provided inside the one coil group among the coil groups.

15 Claims, 23 Drawing Sheets

(51) Int. Cl.
*H01L 21/687* (2006.01)
*H01L 21/67* (2006.01)
*H01L 21/683* (2006.01)

(52) U.S. Cl.
CPC .. *H01J 37/32174* (2013.01); *H01J 37/32706* (2013.01); *H01J 37/32724* (2013.01); *H01L 21/68785* (2013.01); *H01L 21/68792* (2013.01); *H01J 37/32458* (2013.01); *H01J 37/32532* (2013.01); *H01L 21/67069* (2013.01); *H01L 21/6831* (2013.01); *H01L 21/6833* (2013.01)

(58) Field of Classification Search
CPC .............. C23C 16/458; C23C 16/4582; C23C 16/4583; C23C 16/4586; C23C 16/46; C23C 16/463; C23C 16/4585
See application file for complete search history.

(56) References Cited

U.S. PATENT DOCUMENTS

| | | | | |
|---|---|---|---|---|
| 6,538,890 | B2* | 3/2003 | Kodaka | H05K 1/0203 257/706 |
| 7,209,096 | B2* | 4/2007 | Chau | H01Q 1/2233 343/702 |
| 7,712,436 | B2* | 5/2010 | Yamazawa | H01J 37/32091 118/723 E |
| 8,398,815 | B2* | 3/2013 | Yamazawa | H01J 37/32174 156/345.44 |
| 2008/0197780 | A1 | 8/2008 | Yamazawa | |
| 2009/0133839 | A1 | 5/2009 | Yamazawa et al. | |
| 2010/0157552 | A1* | 6/2010 | Thom | H01F 27/2823 361/752 |
| 2012/0032756 | A1* | 2/2012 | Long | H03H 1/0007 333/181 |
| 2015/0262793 | A1* | 9/2015 | Okunishi | H01J 37/32256 156/345.24 |

* cited by examiner

FILTER DEVICE AND PLASMA PROCESSING APPARATUS

CROSS-REFERENCE TO RELATED APPLICATIONS

This application is based on and claims priority from Japanese Patent Application No. 2017-086492, filed on Apr. 25, 2017, with the Japan Patent Office, the disclosure of which is incorporated herein in its entirety by reference.

TECHNICAL FIELD

An exemplary embodiment of the present disclosure relates to a filter device and a plasma processing apparatus.

BACKGROUND

A plasma processing apparatus is used to manufacture an electronic device such as a semiconductor device. The plasma processing apparatus includes a chamber main body, a stage, and a high-frequency power source. The chamber main body provides an internal space thereof as a chamber. The stage is provided in the chamber and configured to hold a workpiece placed on the stage. The stage includes a lower electrode and an electrostatic chuck. The high-frequency power source is connected to the lower electrode.

In a plasma processing performed by the plasma processing apparatus, it is necessary to adjust a in-plane temperature distribution of a workpiece. In some instances, the stage has a plurality of heaters in order to adjust the in-plane temperature distribution of the workpiece. The plurality of heaters are connected to a heater controller through a plurality of power supply lines, respectively.

High-frequency waves are supplied to the lower electrode of the stage from the high-frequency power source. The high-frequency waves supplied to the lower electrode may be introduced into the plurality of power supply lines. Therefore, filters for blocking or attenuating the high-frequency wave are provided in the plurality of power supply lines, respectively.

A plasma processing apparatus disclosed in Japanese Patent Laid-Open Publication No. 2014-099585 uses a plurality of filters. Each of the plurality of filters has a coil and a capacitor. The coil constitutes a part of a power supply line and is accommodated in a casing. The casing is made of a conductor. Electric potential of the casing is set as ground electric potential. The capacitor is connected between the coil and the ground. In each of the plurality of filters, the coil and the casing form a distribution constant line. Each of the plurality of filters has a plurality of resonant frequencies. The coils of the plurality of filters are provided directly under the chamber main body of the plasma processing apparatus.

SUMMARY

According to one aspect, a filter device is provided. The filter device includes a plurality of coils, a plurality of capacitors, and a frame. The plurality of capacitors are connected between the plurality of coils and the ground. The frame is electrically grounded and accommodates therein the plurality of coils. That is, the filter device includes a plurality of filters each including a coil and a capacitor. The plurality of coils constitute a plurality of coil groups. Each of the plurality of coil groups includes two or more coils. The two or more coils in each of the plurality of coil groups are provided such that respective windings of the two or more coils extend spirally about a central axis and respective turns of the two or more coils are sequentially and repeatedly arranged in an axial direction in which the central axis extends. In other words, the windings of the two or more coils included in each of the plurality of coil groups are arranged in a multilayered manner in the axial direction and spirally provided about the central axis. The plurality of coil groups are provided coaxially with the central axis. A pitch between the respective turns of the two or more coils of any one coil group among the plurality of coil groups is larger than a pitch between the respective turns of the two or more coils of the coil group provided inside the one coil group among the plurality of coil groups.

The foregoing summary is illustrative only and is not intended to be in any way limiting. In addition to the illustrative aspects, embodiments, and features described above, further aspects, embodiments, and features will become apparent by reference to the drawings and the following detailed description

DESCRIPTION OF EMBODIMENT

Figure 1:
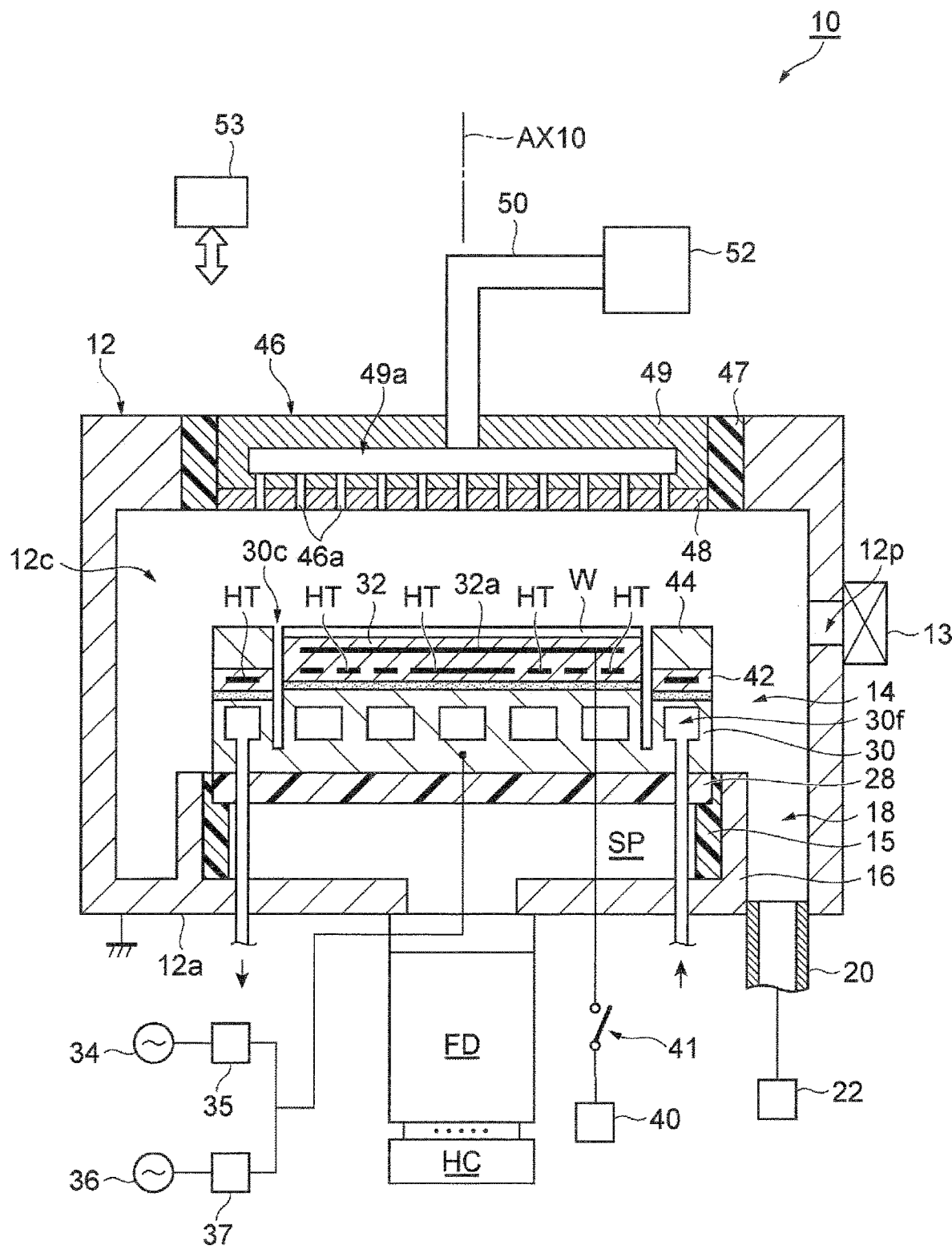
FIG. 1 is a view schematically illustrating a plasma processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

A size of a space available directly under the chamber main body of the plasma processing apparatus is limited because various components are provided directly under the chamber main body. Therefore, when the number of heaters provided on the stage of the plasma processing apparatus is increased, it is difficult to dispose the coils of the plurality of filters in the space directly under the chamber main body. For this reason, the coils of the plurality of filters need to be disposed to be spaced apart from the chamber main body, and long power supply lines need to be provided between the coils of the plurality of filters and the heater controller. The long power supply line decreases impedance of the plurality of filters due to stray capacitance. Therefore, the coils of the plurality of filters are required to be disposed in a small space.

According to one aspect, a filter device is provided. The filter device includes a plurality of coils, a plurality of capacitors, and a frame. The plurality of capacitors are connected between the plurality of coils and the ground. The frame is electrically grounded and accommodates therein the plurality of coils. That is, the filter device includes a plurality of filters each including a coil and a capacitor. The plurality of coils constitute a plurality of coil groups. Each of the plurality of coil groups includes two or more coils. The two or more coils in each of the plurality of coil groups are provided such that respective windings of the two or more coils extend spirally about a central axis and respective turns of the two or more coils are sequentially and repeatedly arranged in an axial direction in which the central axis extends. In other words, the windings of the two or more coils included in each of the plurality of coil groups are arranged in a multilayered manner in the axial direction and spirally provided about the central axis. The plurality of coil groups are provided coaxially with the central axis. A pitch between the respective turns of the two or more coils of any one coil group among the plurality of coil groups is larger than a pitch between the respective turns of the two or more coils of the coil group provided inside the one coil group among the plurality of coil groups.

In the filter device according to one aspect, the plurality of coil groups each including the two or more coils are provided coaxially to share the central axis. Therefore, a space occupied by the plurality of coils, which constitute the plurality of coil groups, is small. For this reason, the coils of the plurality of filters may be disposed in the small space. In addition, the impedance of the plurality of filters is decreased in a case in which the plurality of coils are merely arranged in parallel, but the filter device according to one aspect inhibits the decrease in impedance as the plurality of coils are coupled to one another. Further, the pitch between the turns of each of the two or more coils of the outer coil group is larger than the pitch between the turns of each of the two or more coils of the coil group disposed inside the outer coil group, and as a result, a difference in inductance between the plurality of coils is decreased. For this reason, a difference in frequency characteristics of impedance between the plurality of filters is decreased.

In one exemplary embodiment, pitches between the turns of the plurality of coils are set such that the plurality of coils have substantially the same inductance.

In one exemplary embodiment, the plurality of coils have substantially the same coil length. In one exemplary embodiment, a difference in coil length between a coil having a maximum coil length and a coil having a minimum coil length among the plurality of coils is 3% or less of the minimum coil length. According to these exemplary embodiments, the difference in frequency characteristics of impedance between the plurality of filters is further decreased.

In one exemplary embodiment, the windings of the plurality of coils have one ends and the other ends at a side of the plurality of capacitors, respectively, and the one ends of the windings of the plurality of coils are provided along a plane orthogonal to the central axis. That is, in the exemplary embodiment, the positions of one ends of the windings of the plurality of coils are aligned in the axial direction. According to the exemplary embodiment, the difference in frequency characteristics of impedance between the plurality of filters is further decreased.

In one exemplary embodiment, the plurality of coils have extension lines that extend in the axial direction from one ends of the windings of the plurality of coils, respectively. In each of the plurality of coil groups, the extension lines of the two or more coils are disposed at equal intervals in a circumferential direction about the central axis. According to the exemplary embodiment, the difference in frequency characteristics of impedance between the plurality of filters is further decreased. In one exemplary embodiment, the extension lines of the plurality of coils are provided within an angular range having an angle of 90° or more and 270° or less about the central axis. According to these exemplary embodiments, the difference in frequency characteristics of impedance between the plurality of filters is further decreased.

In one exemplary embodiment, a distance in the radial direction of a gap between any two coil groups, which are adjacent to each other in the radial direction among the plurality of coil groups, is 1.5 mm or less. In the exemplary embodiment, the difference in frequency characteristics of impedance between the plurality of filters is further decreased.

In one exemplary embodiment, the inner diameter of the two or more coils of the coil group provided at an outermost side among the plurality of coil groups is equal to or less than 1.83 times the inner diameter of the two or more coils of the coil group provided at an innermost side among the plurality of coil groups. According to the exemplary embodiment, the difference in frequency characteristics of impedance between the plurality of filters is further decreased.

According to another aspect, a plasma processing apparatus is provided. The plasma processing apparatus includes a chamber main body, a stage, a high-frequency power source, a heater controller, and any one of the aforementioned filter devices. The stage has a lower electrode and a plurality of heaters and is provided in the chamber main body. The high-frequency power source is electrically connected to the lower electrode. The heater controller is configured to provide electric power to the plurality of heaters. Each of the plurality of coils of the filter device is electrically connected between the heater controller and a corresponding heater among the plurality of heaters. In the plasma processing apparatus, the plurality of filters provided by the filter device inhibit high-frequency waves supplied to the stage from being introduced into the heater controller. In addition, a space occupied by the coils of the plurality of filters is small, and as a result, the coils of the plurality of filters may be disposed in the small space.

As described above, the coils of the plurality of filters may be disposed in a small space.

Hereinafter, various exemplary embodiments will be described in detail with reference to the drawings. Further, in the respective drawings, like reference numerals denote like parts or corresponding parts.

FIG. 1 is a view schematically illustrating a plasma processing apparatus according to an exemplary embodiment. In FIG. 1, the plasma processing apparatus according to the exemplary embodiment is illustrated in a state in which the plasma processing apparatus is partially cut out. A plasma processing apparatus 10 illustrated in FIG. 1 is a capacitively coupled plasma processing apparatus. The plasma processing apparatus 10 includes a chamber main body 12. The chamber main body 12 has a substantially cylindrical shape and provides an internal space thereof as a chamber 12c. The chamber main body 12 is made of, for example, aluminum or stainless steel and grounded. An opening 12p for carry-in/carry-out of a workpiece W is formed in a sidewall of the chamber main body 12. For example, the workpiece W may be a disk-shaped plate made of a material such as silicon. A gate valve 13 for opening and closing the opening 12p is mounted on the sidewall of the chamber main body 12.

A stage 14 is provided in the chamber 12c. The workpiece W is placed on the stage 14. The stage 14 is supported by a support unit 15. The support unit 15 has a substantially cylindrical shape and extends upward from a bottom wall 12a of the chamber main body 12. The support unit 15 is made of a dielectric material such as ceramics. The stage 14 and the support unit 15 are coupled to ensure airtightness of the space in the chamber main body 12. In addition, a lower surface of the stage 14 and an inner wall of the support unit 15 define a space SP. The space SP is connected to an atmospheric space outside the chamber main body 12.

The chamber main body 12 provides a support unit 16. The support unit 16 extends upward from the bottom wall 12a of the chamber main body 12 along an outer circumference of the support unit 15. An exhaust path 18 is formed between the support unit 16 and the sidewall of the chamber main body 12. An exhaust pipe 20 is connected to the exhaust path 18, and an exhaust device 22 is connected to the exhaust pipe 20. The exhaust device 22 is a device for exhaust and decompression of the chamber 12c, and the exhaust device 22 has a pressure controller and a vacuum pump such as a turbo molecular pump.

Figure 2:
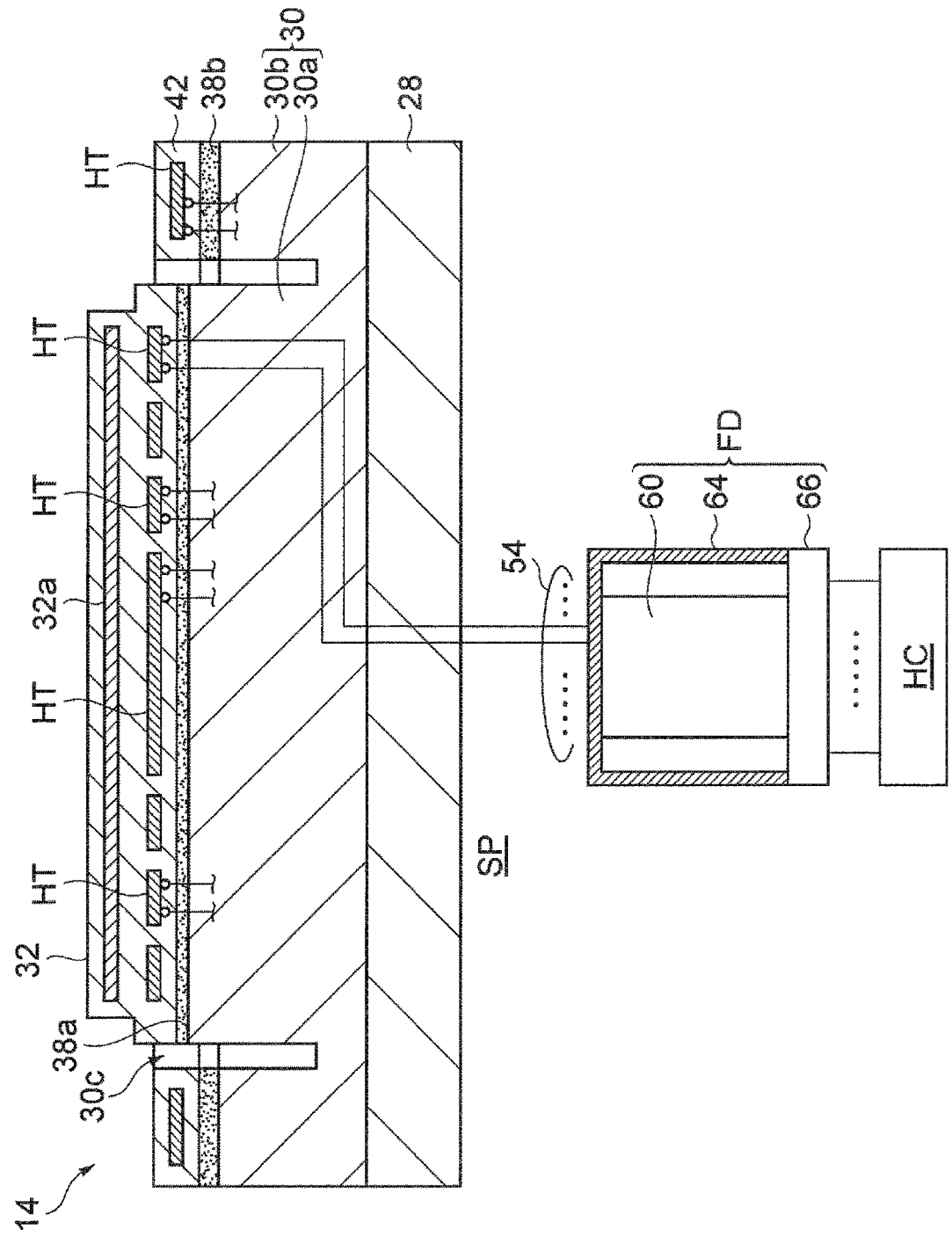
FIG. 2 is an enlarged cross-sectional view of a stage of the plasma processing apparatus illustrated in FIG. 1.

FIG. 2 is an enlarged cross-sectional view of the stage of the plasma processing apparatus illustrated in FIG. 1. FIG. 2 illustrates a filter device FD and a heater controller HC together with the stage 14. Further, FIG. 2 does not illustrate a refrigerant flow path to be described below. Hereinafter, the reference is made to FIG. 2 together with FIG. 1. The stage 14 has a back plate 28, a lower electrode 30, and an electrostatic chuck 32. The back plate 28 has a substantially disk shape and is made of an insulating material such as ceramics. The lower electrode 30 is provided on the back plate 28. The lower electrode 30 has a substantially disk shape and is made of a conductive material such as aluminum. The electrostatic chuck 32 is provided on the lower electrode 30. The electrostatic chuck 32 is a mechanism that attracts the workpiece W to the electrostatic chuck 32 with electrostatic attractive force and holds the workpiece W.

As illustrated in FIG. 1, a first high-frequency power source 34 is connected to the lower electrode 30 through a matching device 35, and a second high-frequency power source 36 is connected to the lower electrode 30 through a matching device 37. The first high-frequency power source 34 outputs a first high-frequency wave that mainly contributes to the formation of plasma. A frequency of the first high-frequency wave is, for example, 100 MHz. The matching device 35 has a matching circuit for matching impedance between the first high-frequency power source 34 and a plasma load. The second high-frequency power source 36 outputs a second high-frequency wave that mainly contributes to an introduction of ion into the workpiece W. A frequency of the second high-frequency wave is lower than the frequency of the first high-frequency wave, and the frequency of the second high-frequency wave is, for example, 13 MHz. The matching device 37 has a matching circuit for matching impedance between the second high-frequency power source 36 and the plasma load.

As illustrated in FIG. 1, a flow path 30f is formed in the lower electrode 30. A refrigerant is supplied into the flow path 30f from a chiller unit provided outside the chamber main body 12. The refrigerant supplied into the flow path 30f returns back to the chiller unit. Further, a gas line, which is configured to supply a heat transfer gas such as He gas between the workpiece W and the electrostatic chuck 32, may be provided in the stage 14.

As illustrated in FIGS. 1 and 2, a groove 30c is formed in an upper surface of the lower electrode 30. The groove 30c extends in a circumferential direction about an axis AX10. The axis AX10 is an axis that extends in a vertical direction, and a center of the stage 14 is on the axis AX10. In addition, the axis AX10 approximately coincides with a central axis of the chamber main body 12. The groove 30c may be an annular groove that extends about the axis AX10. Alternatively, the groove 30c may be intermittently formed in the circumferential direction. The groove 30c thermally divides an upper portion of the lower electrode 30 into an inner portion 30a including the axis AX10 and an outer portion 30b that extends outward from the inner portion 30a. The inner portion 30a is a substantially circular region in a plan view, and the outer portion 30b is a substantially annular region in a plan view.

The inner portion 30a of the lower electrode 30 provides a substantially circular upper surface. The electrostatic chuck 32 is provided on the upper surface of the inner portion 30a by an adhesive 38a. The electrostatic chuck 32 has a substantially disk shape, and has a layer made of an insulating material such as ceramics. The electrostatic chuck 32 also has an electrode 32a as an inner layer made of an insulating material. A power source 40 is connected to the electrode 32a through a switch 41. When voltage, for example, direct current voltage is applied to the electrode 32a from the power source 40, the electrostatic chuck 32 generates electrostatic attractive force. With the electrostatic attractive force, the electrostatic chuck 32 holds the workpiece W.

The outer portion 30b of the lower electrode 30 provides a substantially annular upper surface. A spacer 42 is provided on the upper surface of the outer portion 30b. A focus ring 44 is provided on the spacer 42. The spacer 42 is an annular member, and the spacer 42 is provided on the outer portion 30b of the lower electrode 30 by an adhesive 38b. For example, the spacer 42 is made of an insulating material such as ceramics. The focus ring 44 is a toric member, and the focus ring 44 is made of a material suitable for a process to be performed, for example, quartz or silicon. The focus ring 44 extends to surround an edge of the electrostatic chuck 32 and an edge of the workpiece W.

The stage 14 has a plurality of heaters HT, that is, resistance heating elements. The plurality of heaters HT are provided in the electrostatic chuck 32. As an example, the electrostatic chuck 32 has a plurality of concentric regions about the axis AX10, and one or more heaters are provided in the plurality of regions, respectively. Some of the plurality of heaters HT may be provided in the spacer 42.

The plurality of heaters HT are connected to the heater controller HC through a plurality of power supply lines 54. The heater controller HC includes a heater power source and is configured to individually supply electric power (output an alternating current) to the plurality of heaters HT. The filter device FD is provided on the plurality of power supply lines 54 that connect the plurality of heaters HT and the heater controller HC. The filter device FD is configured to prevent or inhibit a part of the high-frequency wave supplied to the lower electrode 30 from being introduced into the heater controller HC through the plurality of power supply lines 54. The filter device FD and the heater controller HC are provided outside the chamber main body 12. The filter device FD may be mounted on the bottom wall 12a of the chamber main body 12. That is, the filter device FD may be provided directly under the chamber main body 12.

As illustrated in FIG. 1, an upper electrode 46 is provided on a ceiling portion of the chamber main body 12. The upper electrode 46 is supported on the ceiling portion of the chamber main body 12 by a support member 47. The upper electrode 46 has an electrode plate 48 and a support body 49. The electrode plate 48 has a substantially disk shape and is made of, for example, Si or SiC. A lower surface of the electrode plate 48 faces the chamber 12c. The support body 49 supports the electrode plate 48 from above the electrode plate 48. The support body 49 is made of, for example, aluminum, and a film such as an alumite film is formed on a surface of the support body 49. A gas chamber 49a is provided in the support body 49. A plurality of gas ejection holes 46a, which penetrate the support body 49 and the electrode plate 48, are connected to the gas chamber 49a. In addition, a gas supply pipe 50 is connected to the gas chamber 49a. A gas supply unit 52 is connected to the gas supply pipe 50. The gas supply unit 52 is configured to supply a processing gas.

The plasma processing apparatus 10 further has a control unit 53. The control unit 53 includes, for example, a microcomputer. The control unit 53 is configured to control the respective components of the plasma processing apparatus 10, for example, the exhaust device 22, the first high-frequency power source 34, the second high-frequency power source 36, the switch 41, the heater controller HC, the chiller unit, the gas supply unit 52, and the like.

In the plasma processing apparatus 10, for example, at the time of performing etching, the gate valve 13 is opened first, the workpiece W is carried into the chamber 12c, and then the workpiece W is placed on the electrostatic chuck 32. Further, an etching gas is supplied, at a predetermined flow rate, into the chamber 12c from the gas supply unit 52. In addition, pressure in the chamber 12c is reduced by the exhaust device 22. Further, the first high-frequency wave and the second high-frequency wave are supplied to the lower electrode 30 from the first high-frequency power source 34 and the second high-frequency power source 36, respectively. In addition, the heat transfer gas (e.g., He gas) is supplied to a contact interface between the electrostatic chuck 32 and the workpiece W from a heat transfer gas supply unit. In addition, the refrigerant is supplied into the flow path 30f in the lower electrode 30. In addition, an alternating current is outputted to the plurality of heaters HT from the heater controller HC, and a temperature distribution in the stage 14 is adjusted to an assigned temperature distribution. Further, the gas ejected from the plurality of gas ejection holes 46a is excited by a high-frequency electric field. A film of the workpiece W is etched by active species generated by the excitation of the gas.

Figure 3:
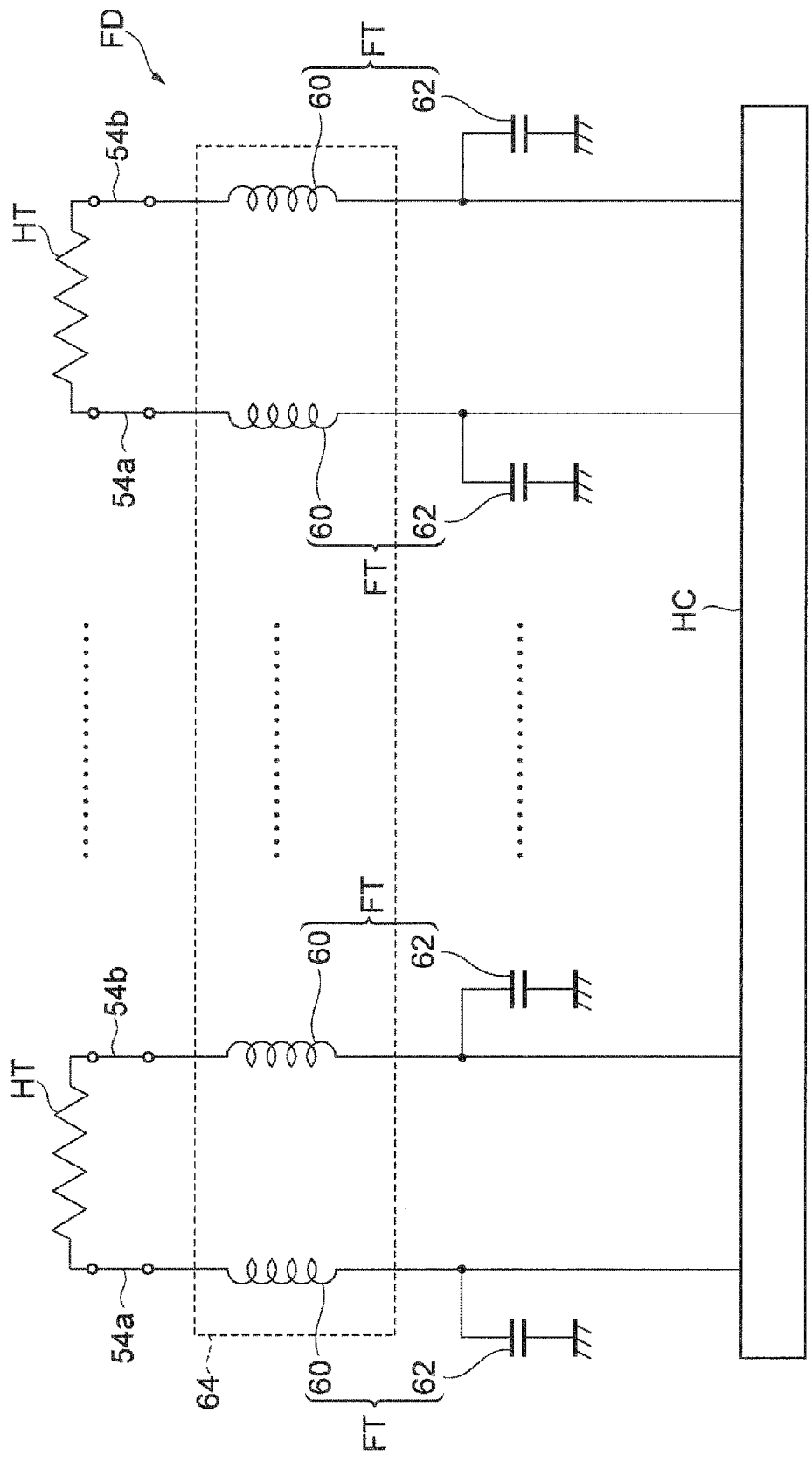
FIG. 3 is a view illustrating a circuit configuration of filters according to the exemplary embodiment, together with a plurality of heaters and a heater controller.

Hereinafter, the filter device FD will be described in detail. FIG. 3 is a view illustrating a circuit configuration of the filter device according to the exemplary embodiment, together with the plurality of heaters and the heater controller. As described above, the plurality of heaters HT are connected to the heater controller HC through the plurality of power supply lines 54 (see FIG. 2). The plurality of power supply lines 54 include a plurality of power supply line pairs. As illustrated in FIG. 3, each of the power supply line pairs includes a power supply line 54a and a power supply line 54b. Each of the plurality of heaters HT has a pair of terminals. The power supply line 54a is connected between the heater controller HC and one terminal of the pair of terminals of the corresponding heater HT, and the power supply line 54b is connected between the heater controller HC and the other terminal of the corresponding heater HT.

As illustrated in FIG. 3, the filter device FD has a plurality of coils 60 and a plurality of capacitors 62. Each of the plurality of coils 60 constitutes a part of each of the plurality of power supply lines 54. That is, each of the plurality of coils 60 constitutes a part of the power supply line 54a or a part of the power supply line 54b. The plurality of coils 60 are accommodated in a frame 64. The frame 64 is a cylindrical container made of a conductive material. The frame 64 is electrically grounded. Each of the plurality of capacitors 62 is connected between the ground and the other end of the corresponding coil 60 which is opposite to one end at the heater HT side. In one exemplary embodiment, the plurality of capacitors 62 are accommodated in a capacitor box 66 (see FIG. 2). As illustrated in FIG. 3, the filter device FD has a plurality of filters FT. Each of the plurality of filters FT includes one coil 60 and one capacitor 62. The coil 60 and the frame 64 of each of the plurality of filters FT constitute a distribution constant line. That is, each of the plurality of filters FT has frequency characteristics of impedance having plurality of resonant frequencies.

Figure 4:
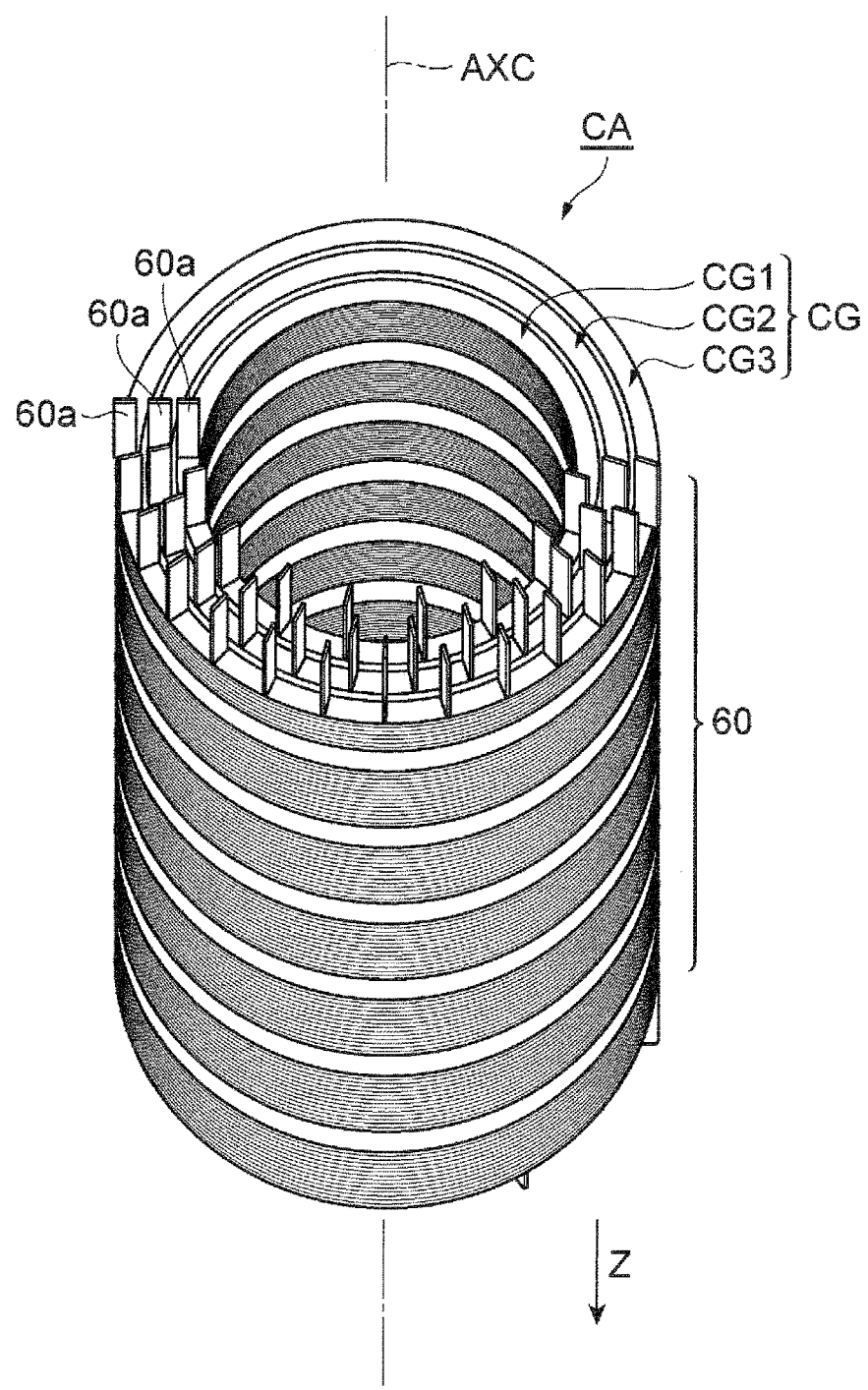
FIG. 4 is a perspective view of a plurality of coils of a filter device according to the exemplary embodiment.
Figure 5:
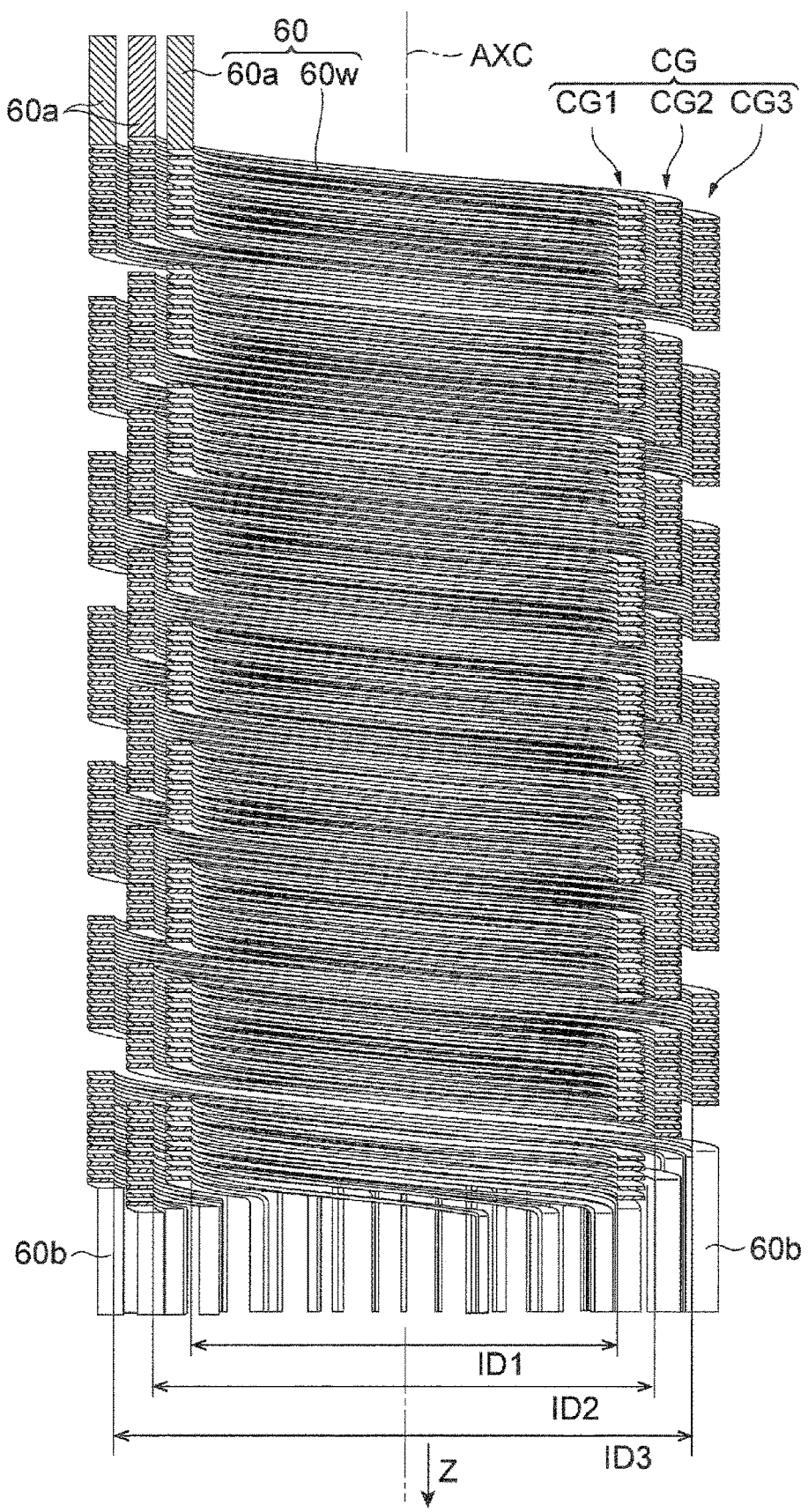
FIG. 5 is a cross-sectional view of the plurality of coils illustrated in FIG. 4.
Figure 6:
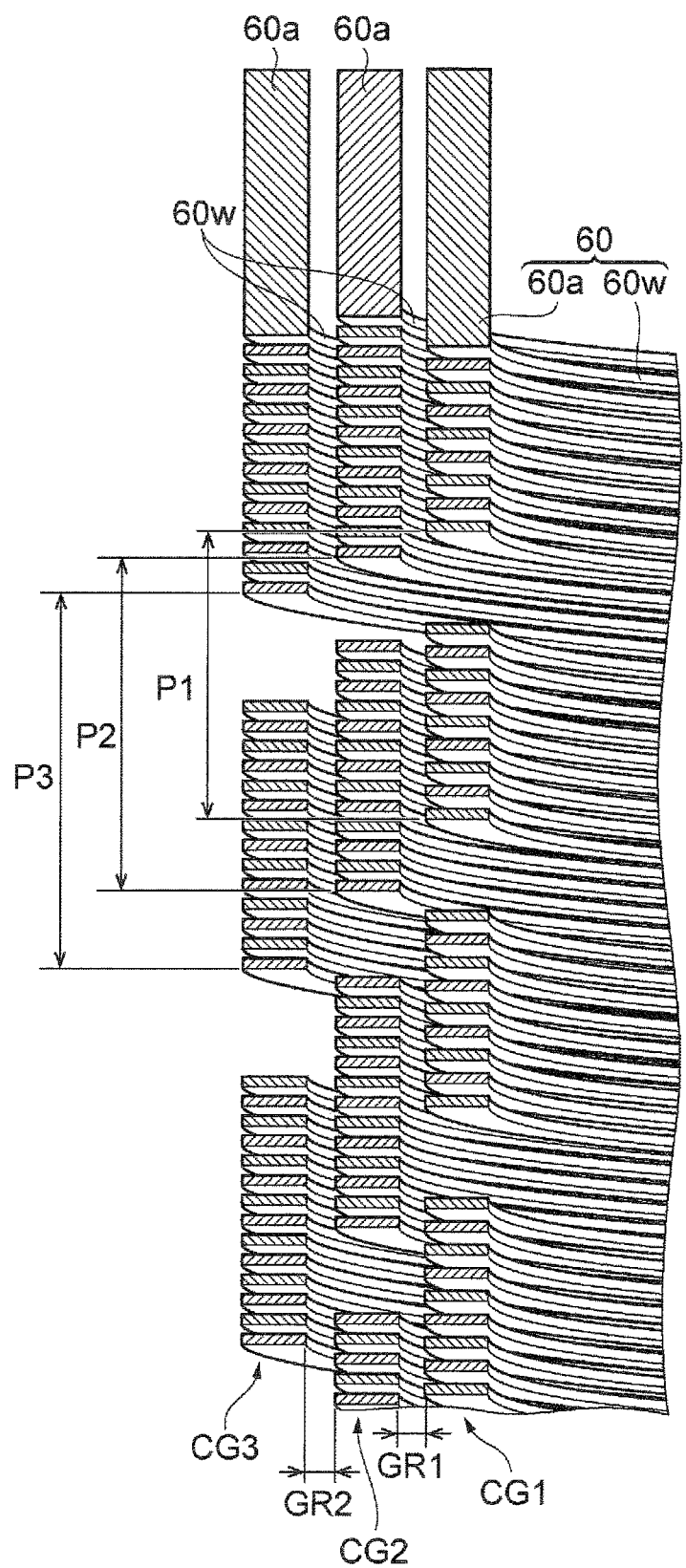
FIG. 6 is a cross-sectional view illustrating a portion of the plurality of coils illustrated in FIG. 4 in an enlarged scale.

Hereinafter, the plurality of coils 60 will be described in detail. FIG. 4 is a perspective view of the plurality of coils of the filter device according to the exemplary embodiment. FIG. 5 is a cross-sectional view of the plurality of coils illustrated in FIG. 4. FIG. 6 is a partially enlarged cross-sectional view of the plurality of coils illustrated in FIG. 4. Each of the plurality of coils 60 may be an air core coil. Each of the plurality of coils 60 has a conductor and a film that covers the conductor. The film is made of an insulating material. The film may be made of resin such as polyetheretherketone (PEEK) or polychlorotrifluoroethylene (PCTFE). In one exemplary embodiment, the film of each of the plurality of coils 60 may have a thickness of 0.1 mm or less.

Each of the plurality of coils 60 has an extension line 60*a*, an extension line 60*b*, and a winding 60*w*. The winding 60*w* extends spirally about a central axis AXC and has a plurality of turns. The extension line 60*a* and the extension line 60*b* extend in an axial direction Z in which the central axis AXC extends. The extension line 60*a* is connected to one end of the winding 60*w*, and the extension line 60*b* is connected to the other end of the winding 60*w*. The other end of the winding 60*w* is an end of the winding 60*w* at the corresponding capacitor 62 side.

A cluster of the plurality of coils 60 constitutes a coil assembly CA. The coil assembly CA includes a plurality of coil groups CG. That is, the plurality of coils 60 constitute the plurality of coil groups CG. The number of coil groups CG may be any number equal to or more than two. In an example illustrated in FIGS. 4 to 6, the plurality of coil groups CG include a coil group CG1, a coil group CG2, and a coil group CG3. Each of the plurality of coil groups CG includes two or more coils 60. The number of coils 60 included in each of the plurality of coil groups CG may be any number equal to or more than two. In the example illustrated in FIGS. 4 to 6, the coil group CG1 includes nine coils 60, the coil group CG2 includes thirteen coils 60, and the coil group CG3 includes fourteen coils 60.

The two or more coils 60 of each of the plurality of coil groups CG are provided such that the windings 60*w* extend spirally about the central axis AXC and are arranged sequentially and repeatedly in the axial direction Z. That is, the windings 60*w* of the two or more coils 60 of each of the plurality of coil groups CG are arranged in a multilayered manner in the axial direction Z and provided spirally about the central axis AXC. In one exemplary embodiment, in each of the plurality of coil groups CG, a distance in the axial direction Z of a gap between turns, which are adjacent to each other in the axial direction Z, may be 0.2 mm or less.

The windings 60*w* of the two or more coils 60 of each of the plurality of coil groups CG share the central axis AXC and have the same inner diameter. In the examples illustrated in FIGS. 4 to 6, the two or more coils 60 included in the coil group CG1 have the same inner diameter ID1, the two or more coils 60 included in the coil group CG2 have the same inner diameter ID2, and the two or more coils 60 included in the coil group CG3 have the same inner diameter ID3. The windings 60*w* of the two or more coils 60 of each of the plurality of coil groups CG may have the same cross-sectional shape and the same cross-sectional dimension. The cross-sectional shape of the plurality of coils 60 may be, for example, a straight angle shape.

The plurality of coil groups CG are provided coaxially with the central axis AXC. In the examples illustrated in FIGS. 4 to 6, the coil groups CG1 to CG3 are provided axially. In the examples illustrated in FIGS. 4 to 6, the coil group CG1 is provided inside the coil group CG2, and the coil group CG2 is provided inside the coil group CG3. That is, the inner diameter ID3 of the windings 60*w* of the two or more coils 60 of the coil group CG3 is larger than an outer diameter of the windings 60*w* of the two or more coils 60 of the coil group CG2, and the inner diameter ID2 of the windings 60*w* of the two or more coils 60 of the coil group CG2 is larger than an outer diameter of the windings 60*w* of the two or more coils 60 of the coil group CG1.

A pitch between the turns of each of the two or more coils 60 of any one coil group among the plurality of coil groups CG is larger than a pitch between the turns of each of the two or more coils 60 of the coil group provided inside the one coil group among the plurality of coil groups CG. In the examples illustrated in FIGS. 4 to 6, a pitch P3 between the turns of the coil 60 of the coil group CG3 is larger than a pitch P2 between the turns of the coil 60 of the coil group CG2, and the pitch P2 is larger than a pitch P1 between the turns of the coil 60 of the coil group CG1. In one exemplary embodiment, the pitches between the turns of the plurality of coils 60 are set such that the plurality of coils 60 have approximately the same inductance.

As described above, in the filter device FD, the plurality of coil groups CG each having the two or more coils 60 are provided coaxially to share the central axis AXC. Therefore, a space, which is occupied by the plurality of coils 60, which constitute the plurality of coil groups CG, that is, the coil assembly CA, is small. For this reason, the coils 60 of the plurality of filters FT, that is, the coil assembly CA may be disposed in the small space. In addition, the impedance of the plurality of filters is decreased in a case in which the plurality of coils are merely arranged in parallel, but the filter device FD inhibits the decrease in impedance as the plurality of coils 60 are coupled to one another. Further, the pitch between the turns of each of the two or more coils of the outer coil group is larger than the pitch between the turns of each of the two or more coils of the coil group disposed inside the outer coil group, and as a result, a difference in inductance between the plurality of coils 60 is decreased. For this reason, a difference in frequency characteristics of impedance between the plurality of filters FT is decreased.

In one exemplary embodiment, the plurality of coils 60 have substantially the same coil length. The coil length is a length in the axial direction Z between one end and the other end of the winding 60*w* of each of the plurality of coils 60. In one exemplary embodiment, among the plurality of coils 60, a difference in coil length between a coil having a maximum coil length and a coil having a minimum coil length is 3% or less of the minimum coil length. According to these exemplary embodiments, the difference in frequency characteristics of impedance between the plurality of filters FT is further decreased.

In one exemplary embodiment, one ends (the ends opposite to the capacitor 62 side ends) of the winding 60*w* of each of the plurality of coils 60 are provided along a plane orthogonal to the central axis AXC. In one exemplary embodiment, the extension lines 60*a* of the two or more coils 60 of each of the plurality of coil groups CG are provided at equal intervals in the circumferential direction about the central axis AXC. In one exemplary embodiment, the extension lines 60*a* of the plurality of coils 60 are provided within an angular range θ (see FIG. 16) having an angle of 90° or more and 270° or less about the central axis AXC. According to these exemplary embodiments, the difference in frequency characteristics of impedance between the plurality of filters FT is further decreased. Meanwhile, the extension lines 60b of the two or more coils 60 of each of the plurality of coil groups CG may also be provided at equal intervals in the circumferential direction about the central axis AXC.

In one exemplary embodiment, a distance in a radial direction of a gap between any two coil groups, which are adjacent to each other in the radial direction about the central axis AXC among the plurality of coil groups CG, is 1.5 mm or less. In the examples illustrated in FIGS. 4 to 6, a distance GR1 in the radial direction of a gap between the coil group CG1 and the coil group CG2, that is, a half (½) of a difference between the outer diameter of the windings 60w of the two or more coils 60 of the coil group CG1 and the inner diameter of the windings 60w of the two or more coils 60 of the coil group CG2 is 1.5 mm or less. In addition, a distance GR2 in the radial direction of a gap between the coil group CG2 and the coil group CG3, that is, a half (½) of a difference between the outer diameter of the windings 60w of the two or more coils 60 of the coil group CG2 and the inner diameter of the windings 60w of the two or more coils 60 of the coil group CG3 is 1.5 mm or less. According to this exemplary embodiment, the difference in frequency characteristics of impedance between the plurality of filters FT is further decreased.

In one exemplary embodiment, the inner diameter of the two or more coils 60 of the coil group provided at an outermost side among the plurality of coil groups CG is equal to or less than 1.83 times the inner diameter of the two or more coils of the coil group provided at an innermost side among the plurality of coil groups CG. In the examples illustrated in FIGS. 4 to 6, the inner diameter ID3 of each of the two or more coils 60 of the coil group CG3 is equal to or less than 1.83 times the inner diameter ID1 of each of the two or more coils 60 of the coil group CG1. According to this exemplary embodiment, the difference in frequency characteristics of impedance between the plurality of filters FT is further decreased.

In the plasma processing apparatus 10, the plurality of filters FT provided in the filter device FD inhibit the high-frequency wave supplied to the stage 14 from being introduced into the heater controller HC. Since the space occupied by the coils 60 of the plurality of filters FT is small, the coils of the plurality of filters FT (i.e., the coil assembly CA) may be disposed in the small space, for example, directly under the chamber main body 12.

Hereinafter, simulations performed to evaluate the filter device FD will be described.

[First and Second Simulations]

Figure 7:
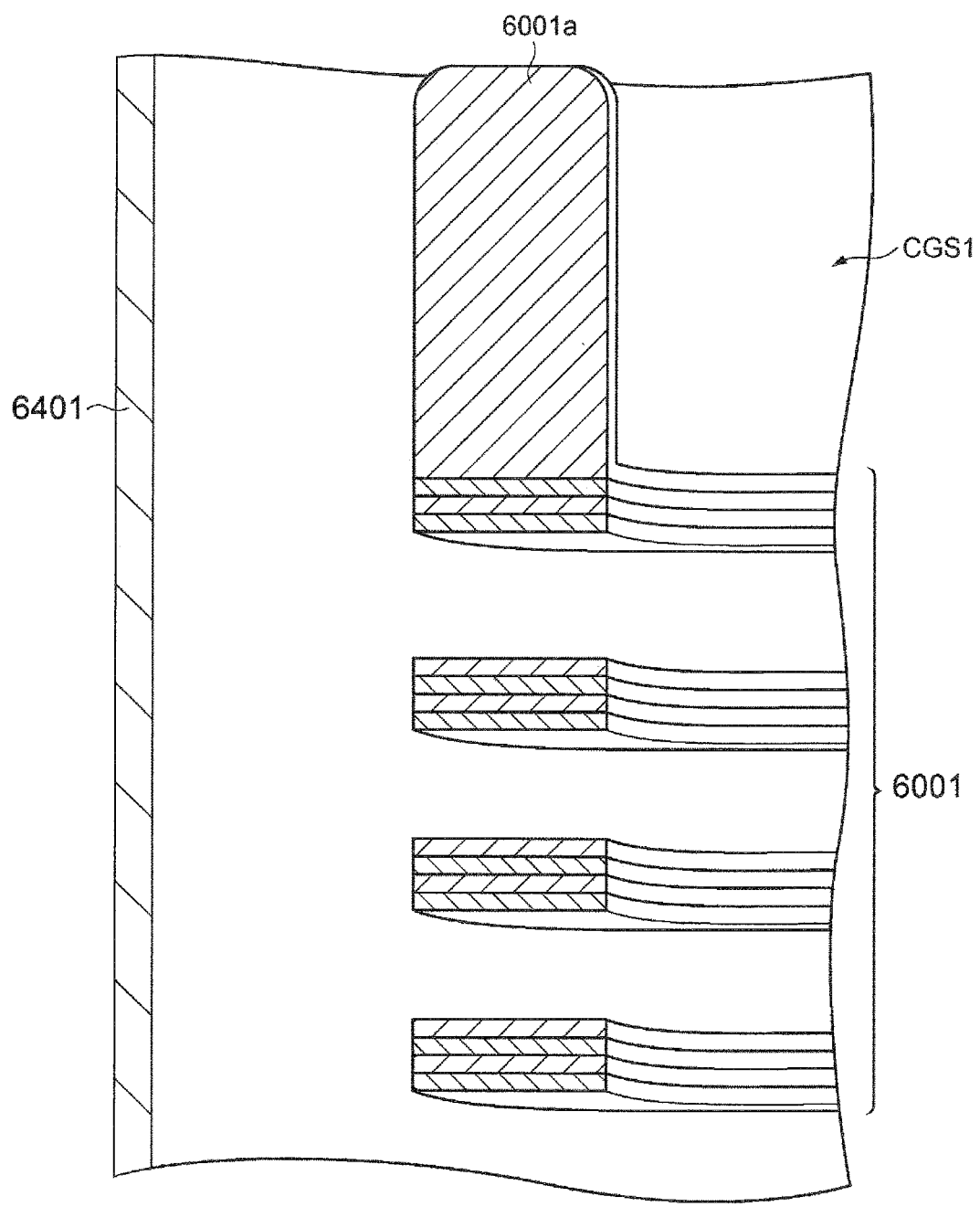
FIG. 7 is a cross-sectional view illustrating a portion of a coil group used for a first simulation in an enlarged scale.

FIG. 7 is a partially enlarged cross-sectional view of a coil group used for a first simulation. In the first simulation, frequency characteristics of combined impedance of four filters each having four coils 6001 were calculated. Hereinafter, the frequency characteristics of the combined impedance of the plurality of filters are referred to as "frequency characteristics of combined impedance". In the first simulation, the four coils 6001 were set to constitute a single coil group CGS1 and extend similar to the two or more coils 60 of each of the plurality of coil groups CG. The four coils 6001 were set to be disposed in a cylindrical frame 6401 set to electric ground potential. Extension lines 6001a at the one ends of the four coils 6001 were set to be coupled to one another. In addition, in the first simulation, four capacitors were set to be connected between the other ends of the four coils 6001 and the ground.

Hereinafter, detailed settings of the first simulation will be described.

<Setting of First Simulation>
Coil length of each coil 6001: 114 mm
Cross-sectional shape of winding of each coil 6001: straight angle shape of 10 mm×1 mm (width×thickness)
Inner diameter of winding of each coil 6001: 114 mm
Pitch between turns of winding of each coil 6001: 8 mm
Distance in radial direction between outer circumferential surface of each coil 6001 and frame 6401: 13 mm
Capacitance of capacitor connected to each coil 6001: 5600 pF A second simulation differs from the first simulation in that the four coils used in the first simulation are individually accommodated in four cylindrical frames set to electric ground potential.

Figure 8:
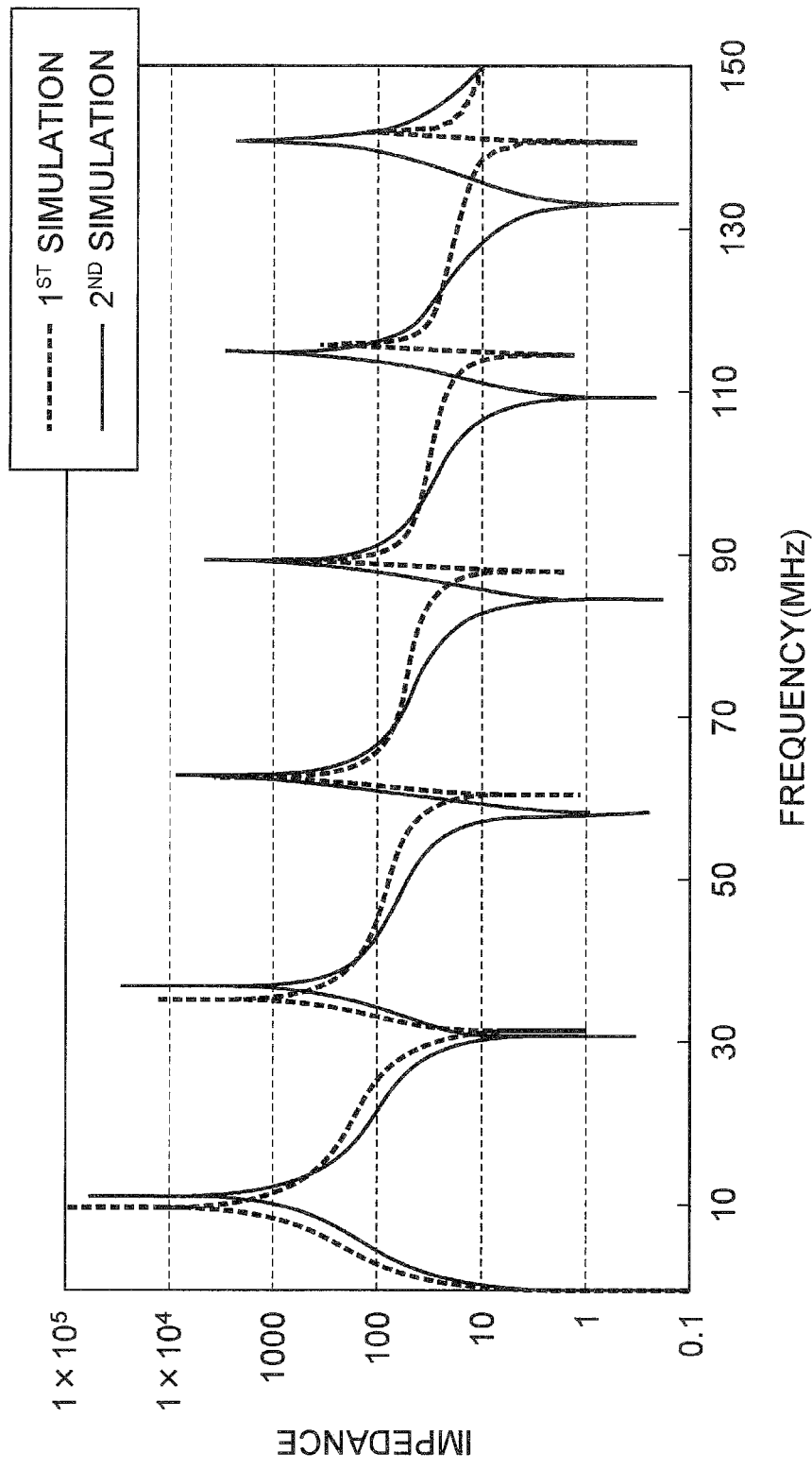
FIG. 8 is a view illustrating frequency characteristics of combined impedance calculated in the first simulation and a second simulation.

FIG. 8 illustrates frequency characteristics of impedance calculated in the first and second simulations. In FIG. 8, a horizontal axis indicates a frequency, and a vertical axis indicates combined impedance. As illustrated in FIG. 8, according to the frequency characteristics of the combined impedance calculated in the first simulation, between the peak frequencies of the impedance, there was obtained impedance higher than impedance according to the frequency characteristics of the combined impedance calculated in the second simulation. According to the result, it was ascertained that in a case in which the plurality of coils were coaxially provided to share a central axis, a decrease in impedance was inhibited by coupling between the plurality of coils in comparison with a case in which the plurality of coils were merely arranged in parallel.

[Third to Sixth Simulations]

Figure 9:
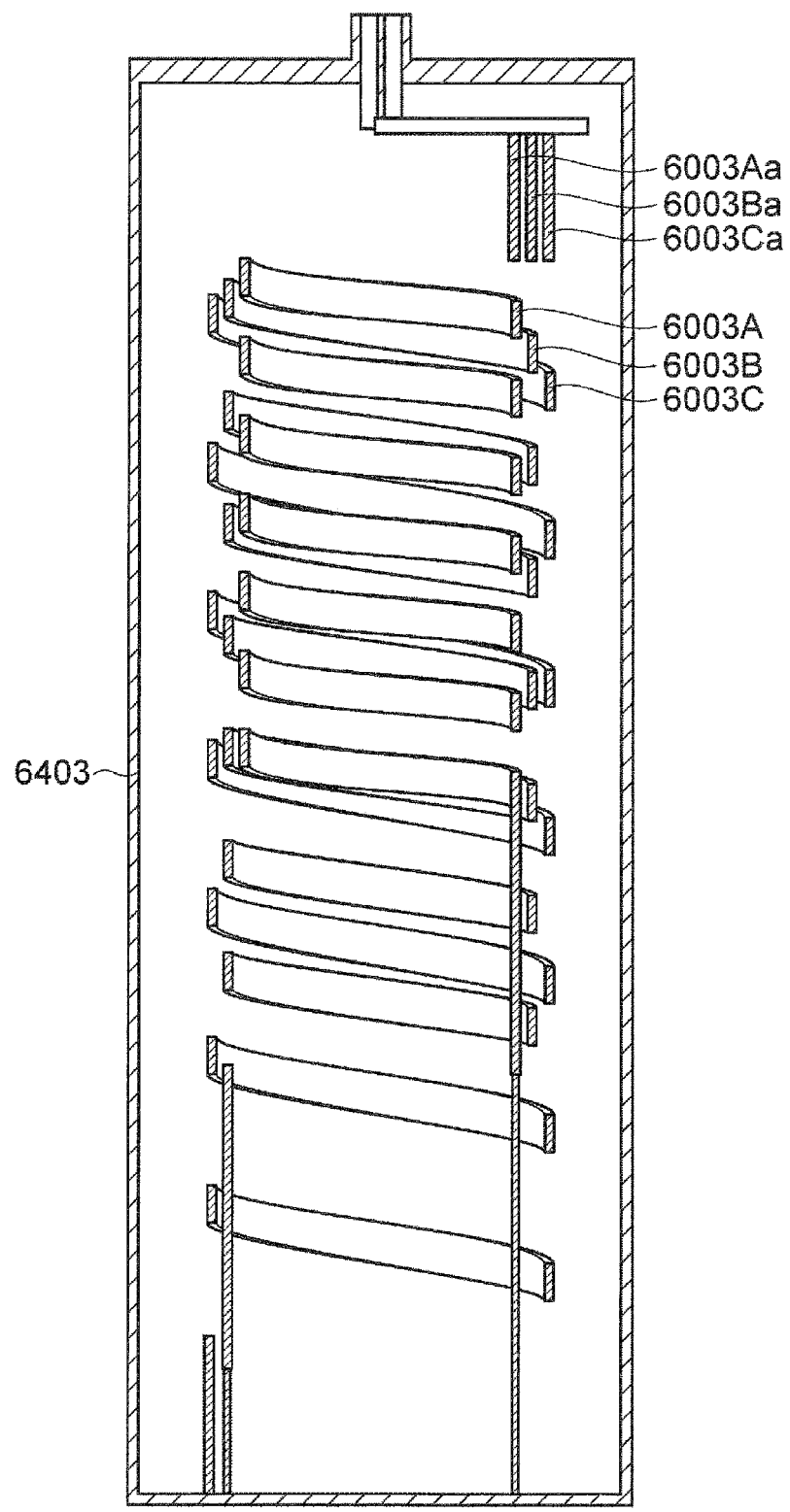
FIG. 9 is a cross-sectional view for explaining a plurality of coils used for third to sixth simulations.

FIG. 9 is a cross-sectional view for explaining plurality of coils used for third to sixth simulations. In the third to sixth simulations, frequency characteristics of combined impedance of three filters each having three coils 6003A, 6003B, and 6003C were calculated. Windings of the three coils 6003A, 6003B, and 6003C were set to have different inner diameters and to extend coaxially and spirally about a common central axis. The three coils 6003A, 6003B, and 6003C were set to be disposed in a cylindrical frame 6403 set to electric ground potential. Extension lines 6003Aa, 6003Ba, and 6003Ca at one end side of the three coils 6003A, 6003B, and 6003C were set to be coupled to one another. In addition, in the third to sixth simulations, three capacitors were set to be connected between the other ends of the three coils 6003A, 6003B, and 6003C and the ground, respectively. In the third to sixth simulations, coil lengths of the three coils 6003A, 6003B, and 6003C were different from one another.

Hereinafter, detailed settings of the third to sixth simulations will be described.

<Common Setting of Third to Sixth Simulations>
Shape of winding of coil 6003A: straight angle shape of 3 mm×9 mm
Inner diameter of winding of coil 6003A: 65 mm
Pitch between turns of winding of coil 6003A: 17.5 mm
Capacitance of capacitor connected to coil 6003A: 5600 pF
Shape of winding of coil 6003B: straight angle shape of 3 mm×9 mm
Inner diameter of winding of coil 6003B: 74 mm
Pitch between turns of winding of coil 6003B: 25.5 mm
Capacitance of capacitor connected to coil 6003B: 5600 pF
Shape of winding of coil 6003C: straight angle shape of 3 mm×9 mm
Inner diameter of winding of coil 6003C: 83 mm
Pitch between turns of winding of coil 6003C: 33.5 mm Distance in radial direction between outer circumferential surface of coil 6003C and frame 6403: 13 mm Capacitance of capacitor connected to coil 6003C: 5600 pF <Setting of Third Simulation>
Coil length of coil 6003A: 122.5 mm
Coil length of coil 6003B: 124.45 mm
Coil length of coil 6003C: 126.21 mm
Ratio of difference between coil length of coil 6003C and coil length of coil 6003A to coil length of coil 6003A: 3%

<Setting of Fourth Simulation>
Coil length of coil 6003A: 122.5 mm
Coil length of coil 6003B: 125.4 mm
Coil length of coil 6003C: 128.7 mm
Ratio of difference between coil length of coil 6003C and coil length of coil 6003A to coil length of coil 6003A: 5%

<Setting of Fifth Simulation>
Coil length of coil 6003A: 122.5 mm
Coil length of coil 6003B: 128.5 mm
Coil length of coil 6003C: 133.4 mm
Ratio of difference between coil length of coil 6003C and coil length of coil 6003A to coil length of coil 6003A: 9%

<Setting of Sixth Simulation>
Coil length of coil 6003A: 122.5 mm
Coil length of coil 6003B: 136.5 mm
Coil length of coil 6003C: 147 mm
Ratio of difference between coil length of coil 6003C and coil length of coil 6003A to coil length of coil 6003A: 20%

Figure 10A:
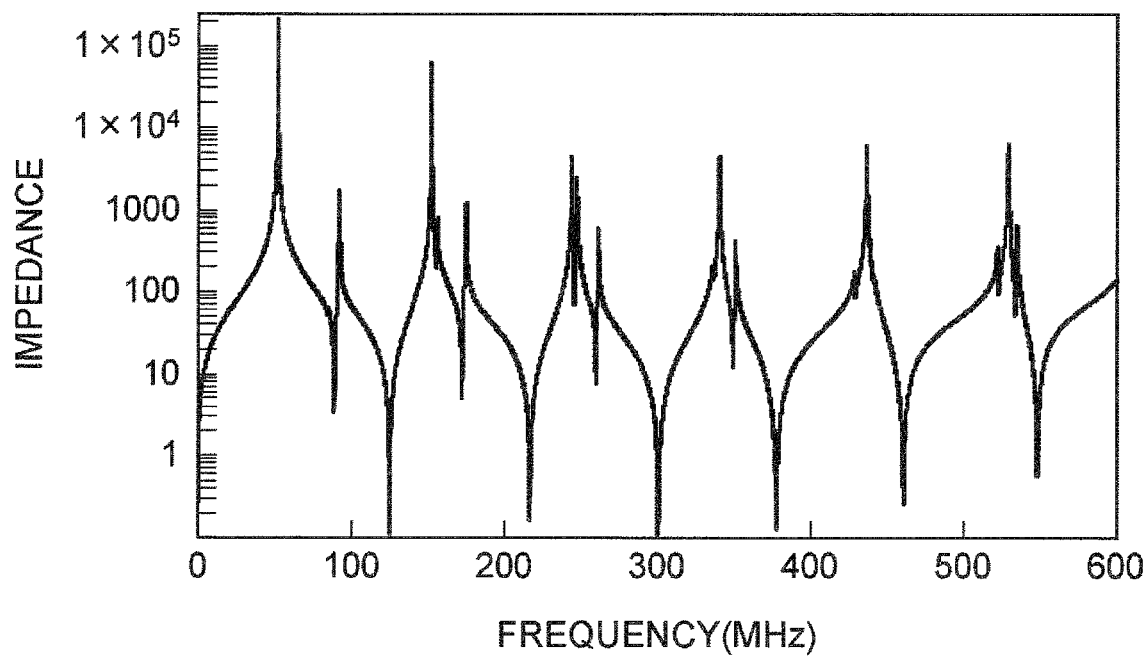
FIG. 10A is a view illustrating frequency characteristics of combined impedance calculated in the third simulation.
Figure 10B:
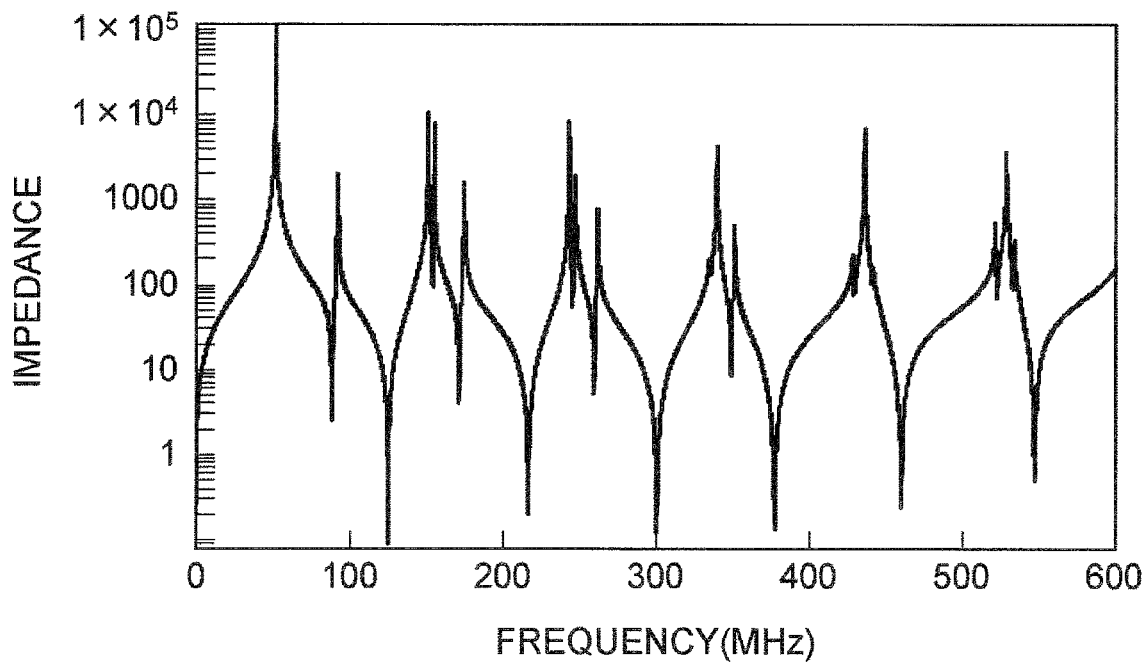
FIG. 10B is a view illustrating frequency characteristics of combined impedance calculated in the fourth simulation.
Figure 11A:
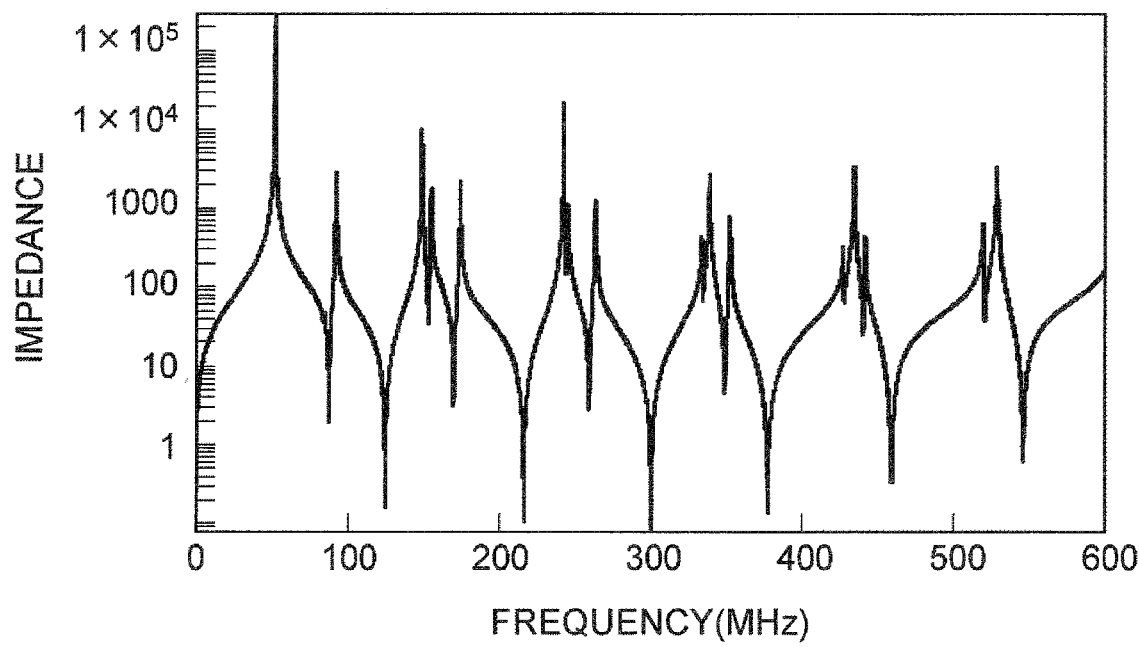
FIG. 11A is a view illustrating frequency characteristics of combined impedance calculated in the fifth simulation.
Figure 11B:
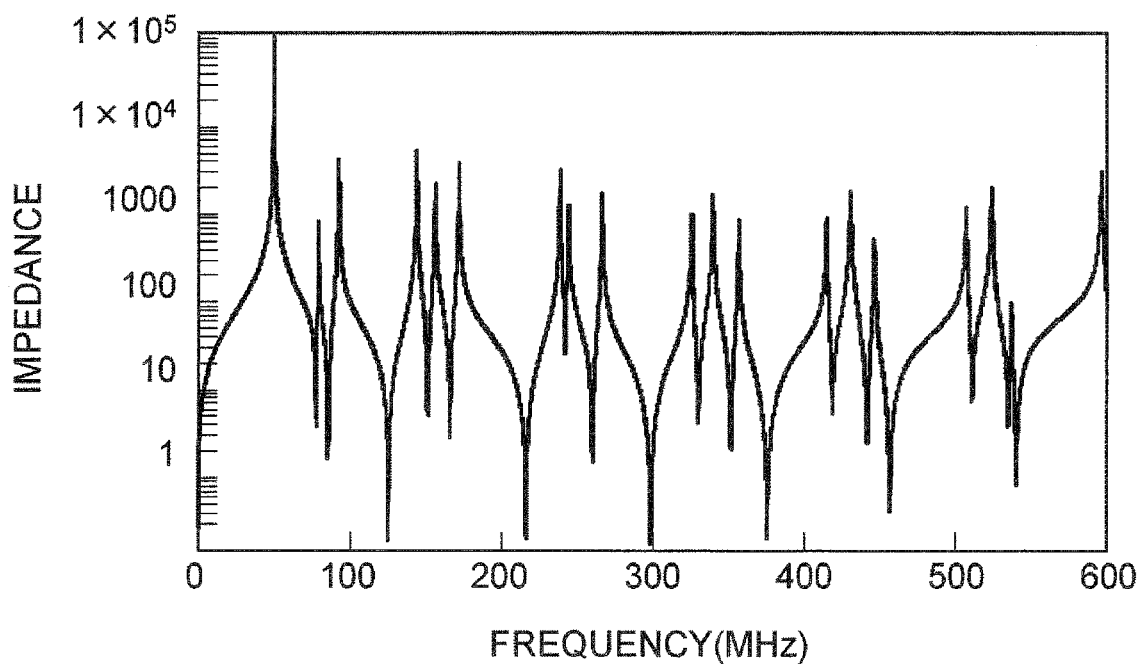
FIG. 11B is a view illustrating frequency characteristics of combined impedance calculated in the sixth simulation.

Frequency characteristics of combined impedance calculated in the third to sixth simulations are illustrated in FIGS. 10A, 10B, 11A, and 11B, respectively. In FIGS. 10A, 10B, 11A, and 11B, horizontal axes indicate frequencies, and vertical axes indicate combined impedance. If the frequency characteristics of the impedance of the plurality of filters are equal to one another in a case in which the extension lines of the coils of the plurality of filters are coupled to one another, the peak frequencies are periodically, that is, regularly shown in the frequency characteristics of the combined impedance. Meanwhile, if the frequency characteristics of the impedance of the plurality of filters are different from one another in the case in which the extension lines of the coils of the plurality of filters are coupled to one another, the regularity of the peak frequencies in the frequency characteristics of the combined impedance is broken. As illustrated in FIGS. 10B, 11A, and 11B, the regularity of the peak frequencies is broken in the frequency characteristics of the combined impedance calculated in the fourth to sixth simulations. Meanwhile, as illustrated in FIG. 10A, according to the frequency characteristics of the combined impedance calculated in the third simulation, the regularity of the peak frequencies was maintained comparatively well. Therefore, it was ascertained that a difference in frequency characteristics of impedance between the plurality of filters was further decreased when among the plurality of coils, a difference in coil length between the coil having the maximum coil length and the coil having the minimum coil length is 3% or less of the minimum coil length.

[Seventh to Ninth Simulations]

Figure 12:
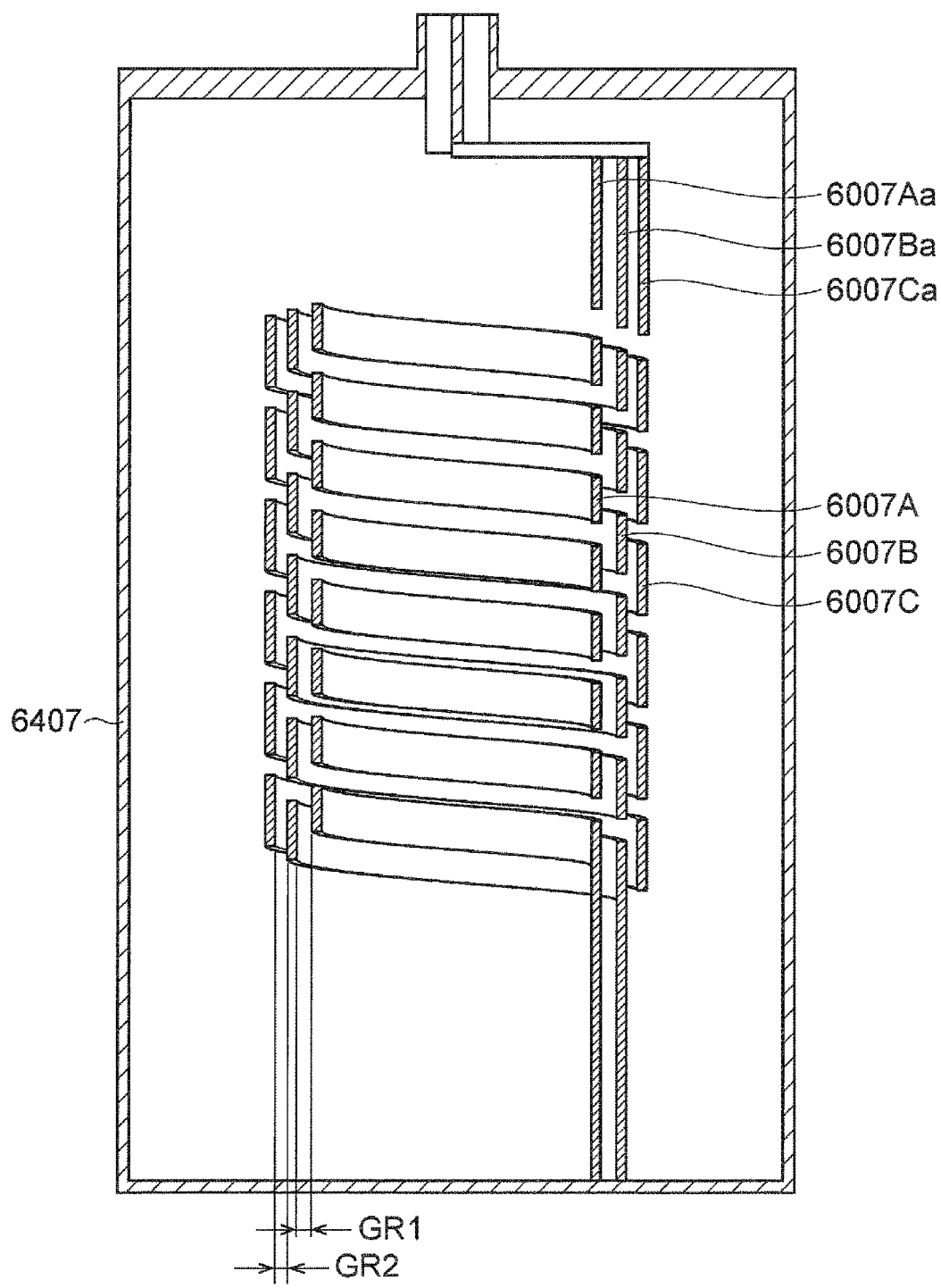
FIG. 12 is a cross-sectional view for explaining a plurality of coils used for seventh to ninth simulations.

FIG. 12 is a cross-sectional view for explaining a plurality of coils used for seventh to ninth simulations. In the seventh to ninth simulations, frequency characteristics of combined impedance of three filters each having three coils 6007A, 6007B, and 6007C were calculated. Windings of the three coils 6007A, 6007B, and 6007C were set to have different inner diameters and to extend coaxially and spirally about a common central axis. The three coils 6007A, 6007B, and 6007C were set to be disposed in a cylindrical frame 6407 set to electric ground potential. Extension lines 6007Aa, 6007Ba, and 6007Ca at one end side of the three coils 6007A, 6007B, and 6007C were set to be coupled to one another. In addition, in the seventh to ninth simulations, three capacitors were set to be connected between the other ends of the three coils 6007A, 6007B, and 6007C and the ground, respectively. In the seventh to ninth simulations, coil lengths of the three coils 6007A, 6007B, and 6007C were equal to one another. In the seventh simulation, a distance GR1 in the radial direction of a gap between the coil 6007A and the coil 6007B and a distance GR2 in the radial direction of a gap between the coil 6007B and the coil 6007C were 1.5 mm, the distance GR1 and the distance GR2 in the eighth simulation were 2.2 mm, and the distance GR1 and the distance GR2 in the ninth simulation were 4 mm.

Hereinafter, detailed settings of the seventh to ninth simulations will be described.

Figure 13A:
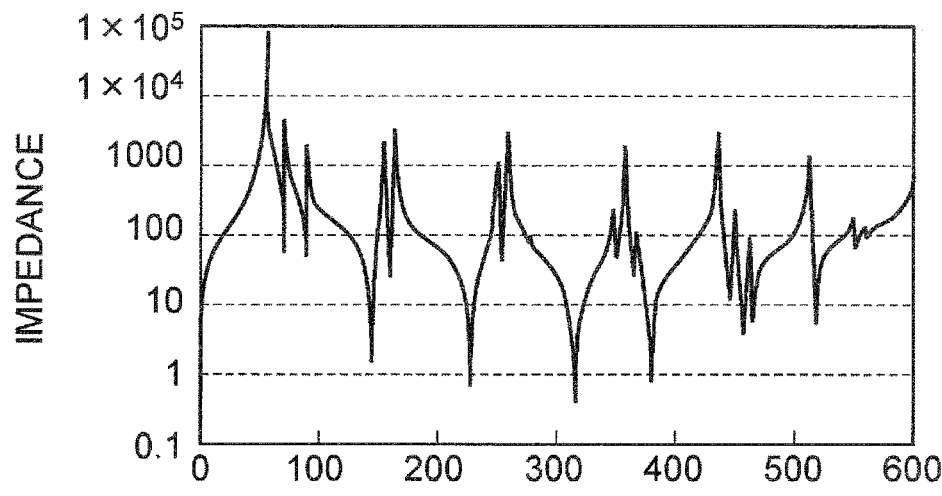
FIGS. 13A, 13B, and 13C are views illustrating frequency characteristics of combined impedance calculated in the seventh to ninth simulations, respectively.
Figure 13B:
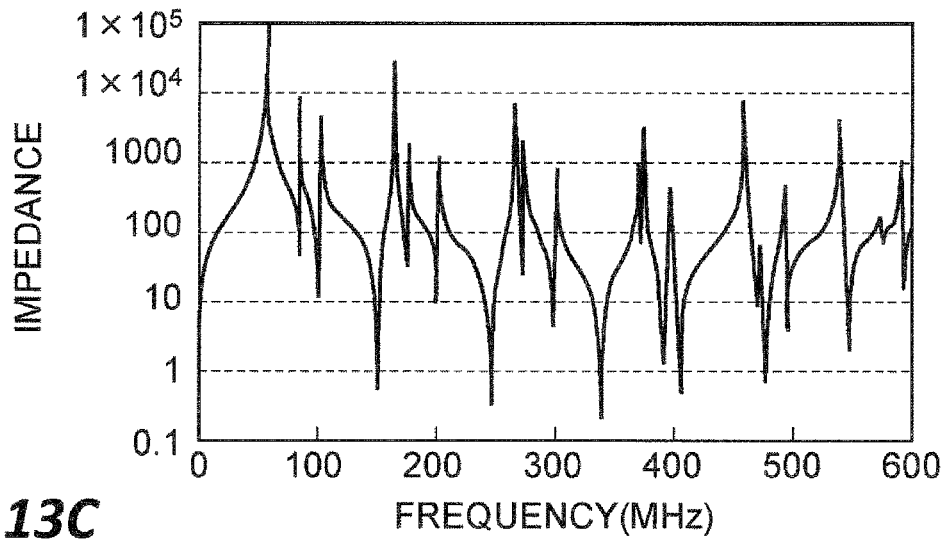
Figure 13C:
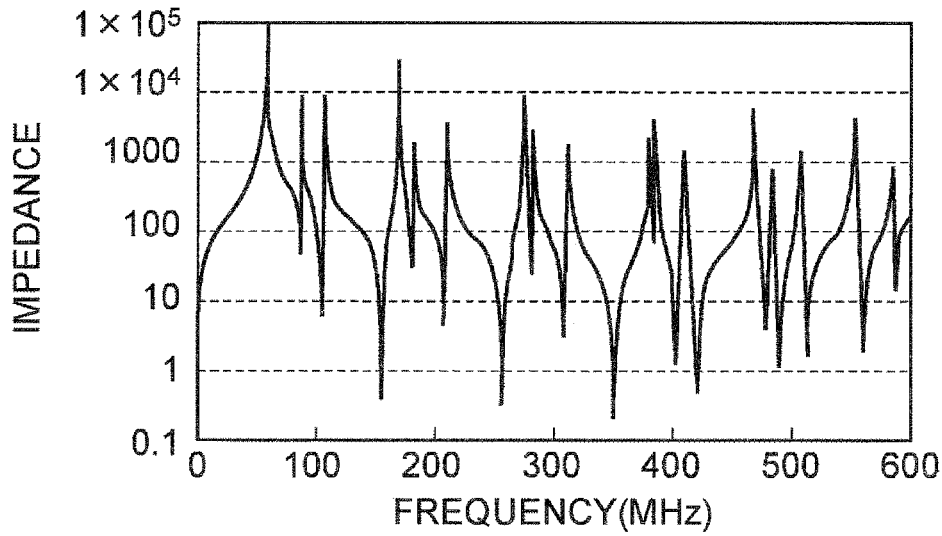

<Common Setting of Seventh to Ninth Simulations>
Coil length of coil 6007A: 122.5 mm
Shape of winding of coil 6007A: straight angle shape of 3 mm×13.5 mm
Inner diameter of winding of coil 6007A: 65 mm
Pitch between turns of winding of coil 6007A: 17.5 mm
Capacitance of capacitor connected to coil 6007A: 5600 pF
Coil length of coil 6007B: 125 mm
Shape of winding of coil 6007B: straight angle shape of 3 mm×16 mm
Inner diameter of winding of coil 6007B: 74 mm
Pitch between turns of winding of coil 6007B: 20 mm
Capacitance of capacitor connected to coil 6007B: 5600 pF
Coil length of coil 6007C: 123.2 mm
Shape of winding of coil 6007C: straight angle shape of 3 mm×18 mm
Inner diameter of winding of coil 6007C: 83 mm
Pitch between turns of winding of coil 6007C: 22 mm
Distance in radial direction between outer circumferential surface of coil 6007C and frame 6407: 13 mm
Capacitance of capacitor connected to coil 6007C: 5600 pF Frequency characteristics of combined impedance calculated in the seventh to ninth simulations are illustrated in FIGS. 13A, 13B, and 13C, respectively. In FIGS. 13A, 13B, and 13C, horizontal axes indicate frequencies, and vertical axes indicate combined impedance. As illustrated in FIGS. 13A, 13B, and 13C, the regularity of peak frequencies was maintained comparatively well in the frequency characteristics of the combined impedance calculated in the seventh simulation in comparison with the frequency characteristics of the combined impedance calculated in the eighth and ninth simulations. According to the result, it was ascertained that a difference in frequency characteristics of impedance between the plurality of filters was further decreased when a distance in the radial direction of a gap between any two coils adjacent to each other in the radial direction was set to 1.5 mm or less in the plurality of filters having the plurality of coils, which had different inner diameters and were provided coaxially. Therefore, it was ascertained that a difference in frequency characteristics of impedance between the plurality of filters was further decreased when a distance in the radial direction of a gap between any two coil groups, which are adjacent to each other in the radial direction among the plurality of coil groups, was set to 1.5 mm.

[Tenth to Thirteenth Simulations]

Figure 14:
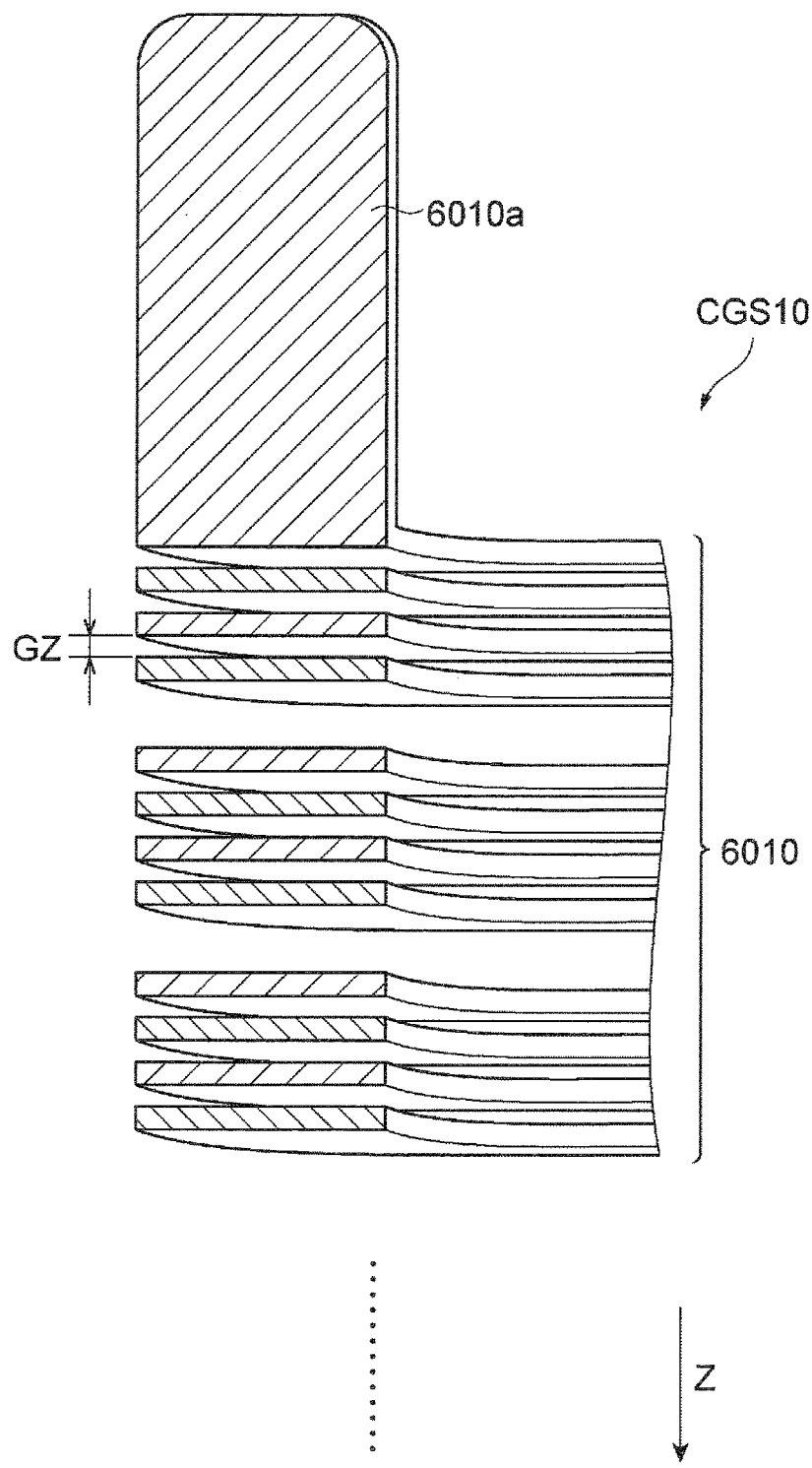
FIG. 14 is a view for explaining a coil group used for tenth to thirteenth simulations.

FIG. 14 is a view for explaining a coil group used for tenth to thirteenth simulations. In the tenth to thirteenth simulations, frequency characteristics of combined impedance of four filters each having four coils 6010 were calculated. In the tenth to thirteenth simulations, the four coils 6010 were set to constitute a single coil group CGS10 and extend similar to the two or more coils 60 of each of the plurality of coil groups CG. The four coils 6010 were set to be disposed in a cylindrical frame set to electric ground potential. Extension lines 6010a at one end side of the four coils 6010 were set to be coupled to one another. In addition, in the tenth to thirteenth simulations, four capacitors were set to be connected between the other ends of the four coils 6010 and the ground, respectively. In the tenth simulation, a distance GZ in the axial direction Z of a gap between the adjacent turns was 0 mm, a distance GZ in the eleventh simulation was 0.2 mm, a distance GZ in the twelfth simulation was 0.5 mm, and a distance GZ in the thirteenth simulation was 1 mm.

Hereinafter, detailed settings of the tenth to thirteenth simulations will be described.

<Common Setting of Tenth to Thirteenth Simulations>

Coil length of each coil 6010: 114 mm

Shape of winding of each coil 6010: straight angle shape of 10 mm×1 mm

Inner diameter of winding of each coil 6010: 114 mm

Pitch between turns of winding of each coil 6010: 8 mm

Figure 15A:
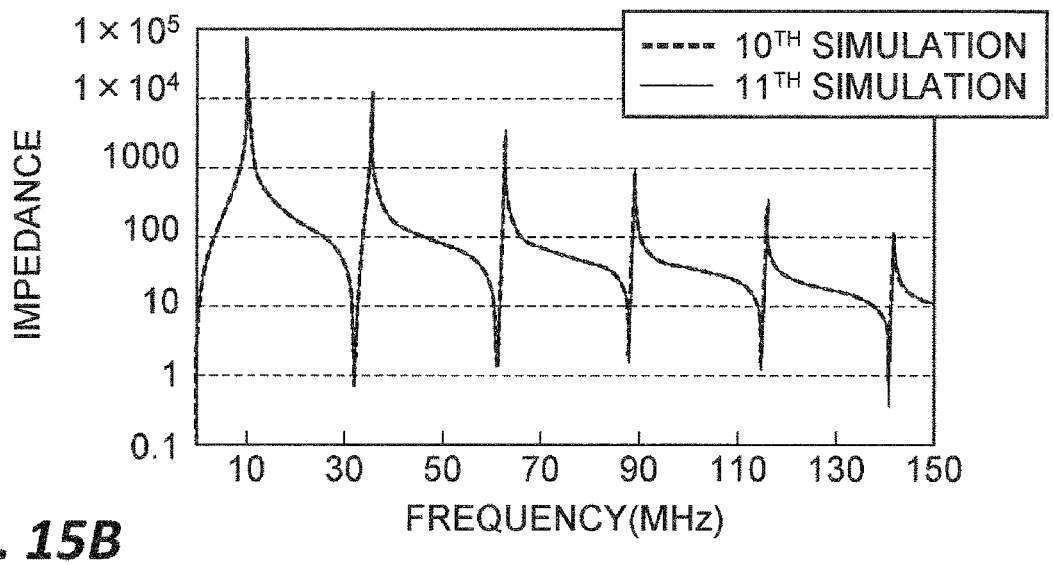
FIG. 15A is a view illustrating frequency characteristics of combined impedance calculated in the tenth and eleventh simulations.
Figure 15B:
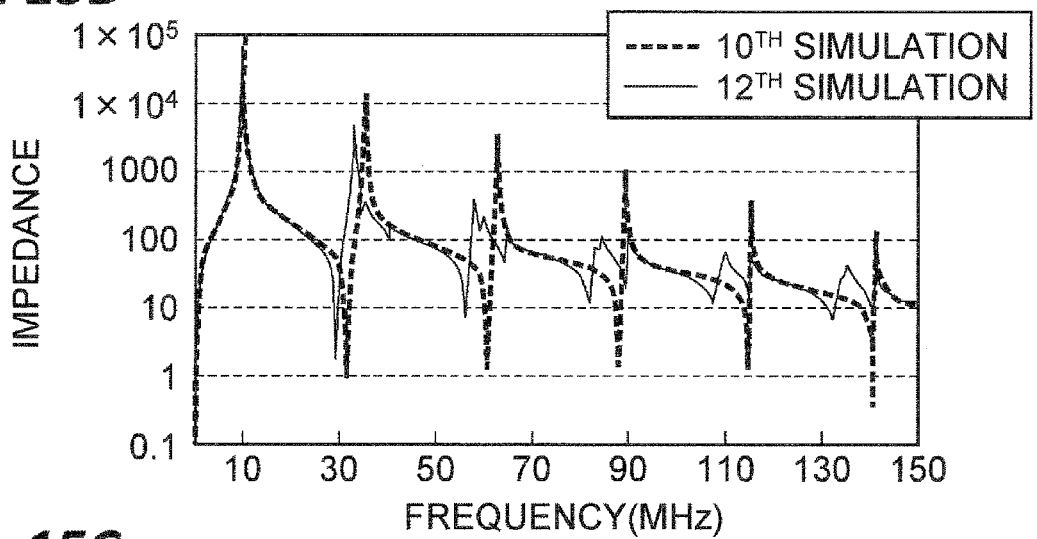
FIG. 15B is a view illustrating frequency characteristics of combined impedance calculated in the tenth and twelfth simulations.
Figure 15C:
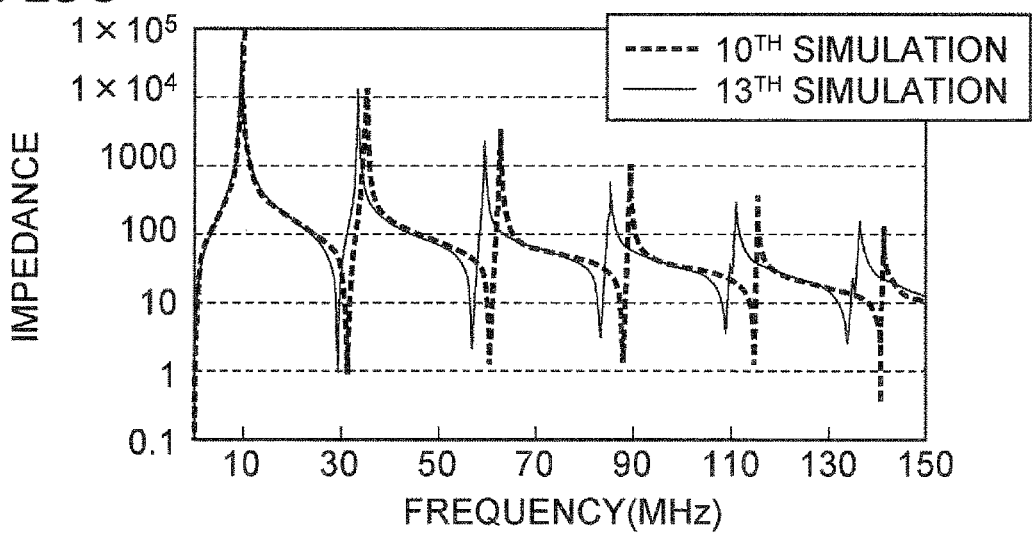
FIG. 15C is a view illustrating frequency characteristics of combined impedance calculated in the tenth and thirteenth simulations.

Distance in radial direction between outer circumferential surface of each coil 6010 and frame: 13 mm Capacitance of capacitor connected to each coil 6010: 5600 pF FIG. 15A illustrates frequency characteristics of combined impedance calculated in the tenth and eleventh simulations, FIG. 15B illustrates frequency characteristics of combined impedance calculated in the tenth and twelfth simulations, and FIG. 15C illustrates frequency characteristics of combined impedance calculated in the tenth and thirteenth simulations. In FIGS. 15A, 15B, and 15C, horizontal axes indicate frequencies, and vertical axes indicate combined impedance. As illustrated in FIGS. 15A, 15B, and 15C, the frequency characteristics of the combined impedance calculated in the tenth simulation approximately coincided with the frequency characteristics of the combined impedance calculated in the eleventh simulation, and greatly differed from the frequency characteristics of the combined impedance calculated in the twelfth and thirteenth simulations. Therefore, it was ascertained that a difference in frequency characteristics of impedance between the plurality of filters was decreased when a distance in the axial direction Z of a gap between the turns, which are adjacent to each other in the axial direction Z, was set to 0.2 mm or less in each of the plurality of coil groups CG.

[Fourteenth to Eighteenth Simulations]

Figure 16:
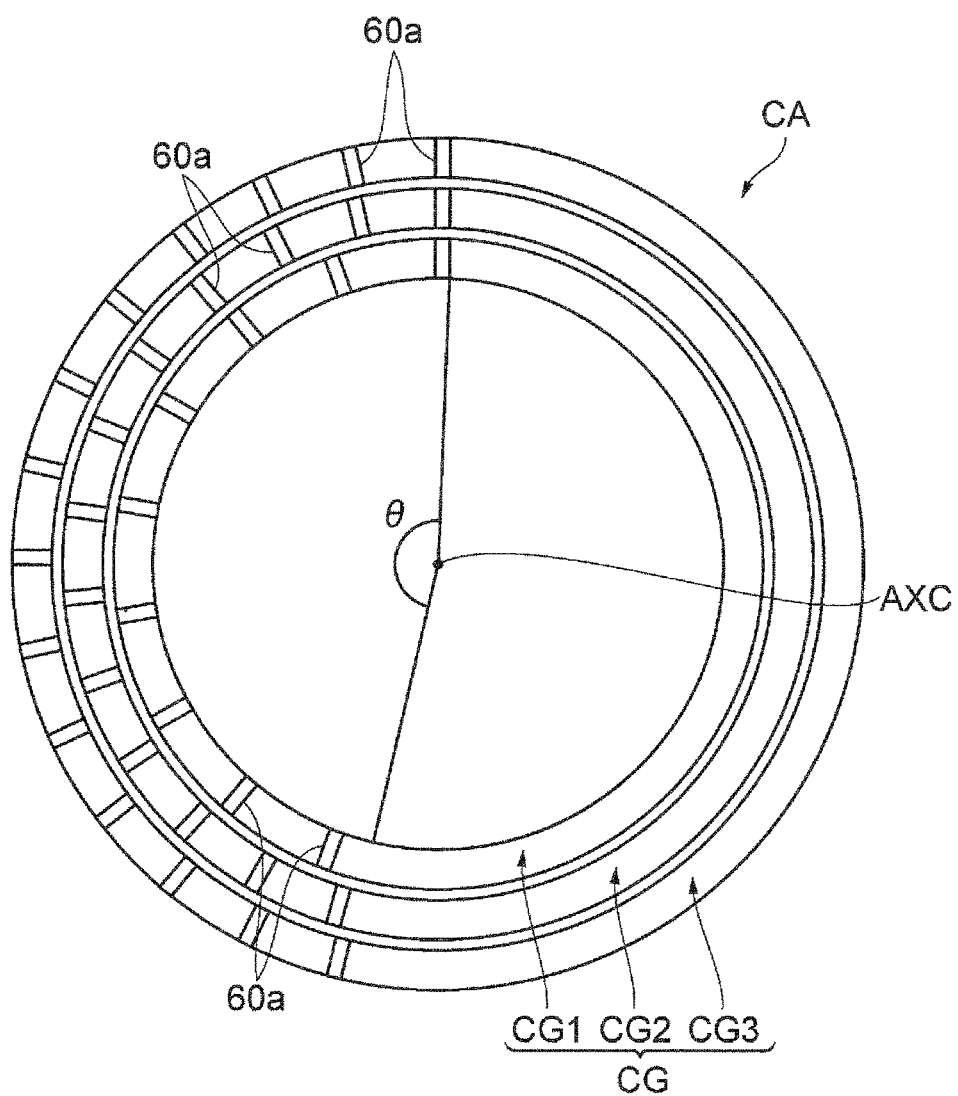
FIG. 16 is a view for explaining an arrangement of extension lines used for fourteenth to eighteenth simulations.
Figure 17A:
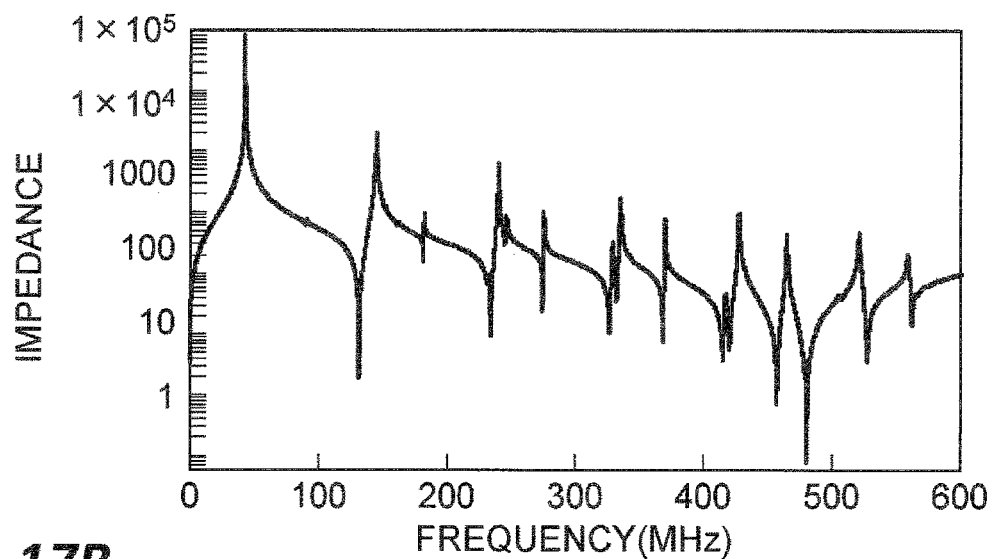
FIGS. 17A, 17B, and 17C are views illustrating frequency characteristics of combined impedance calculated in the fourteenth to sixteenth simulations, respectively.
Figure 17B:
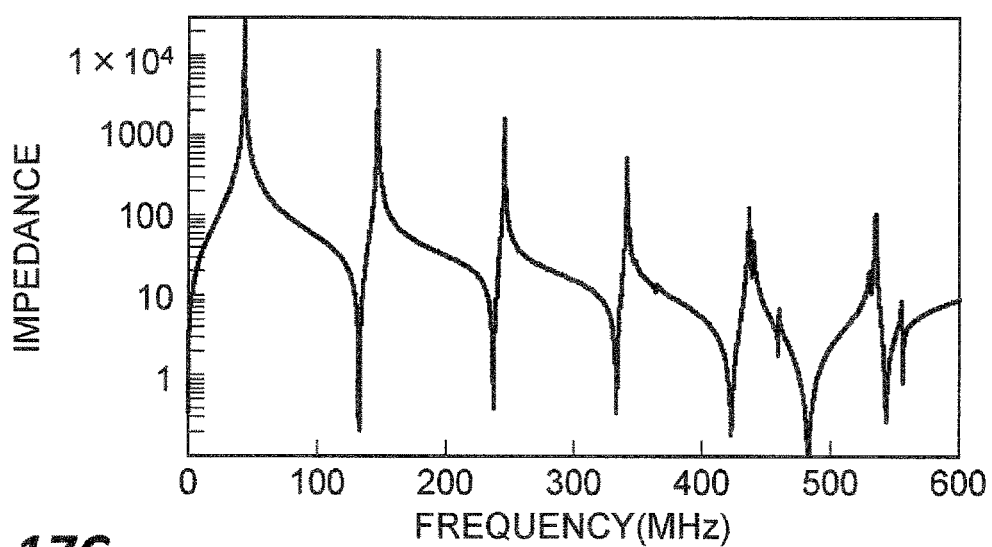
Figure 17C:
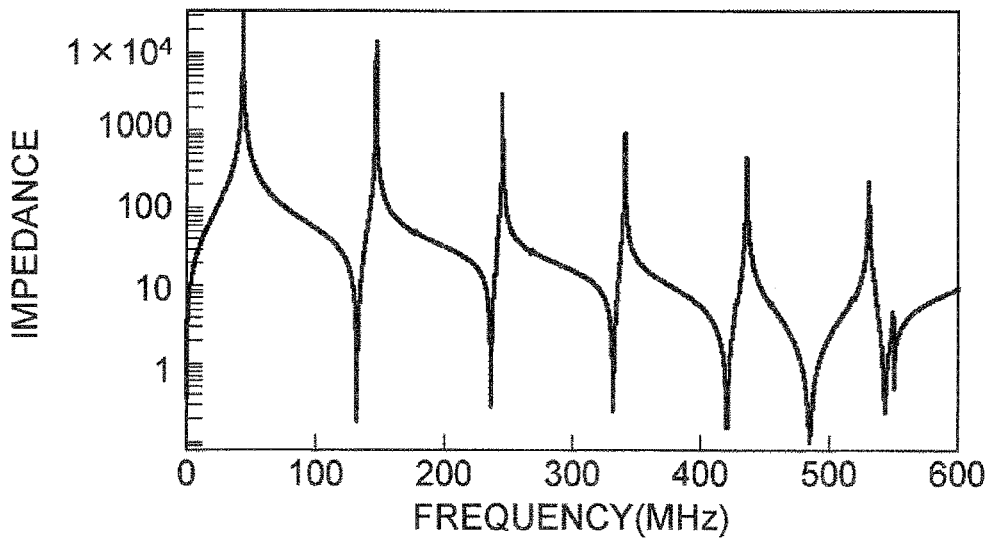
Figure 18A:
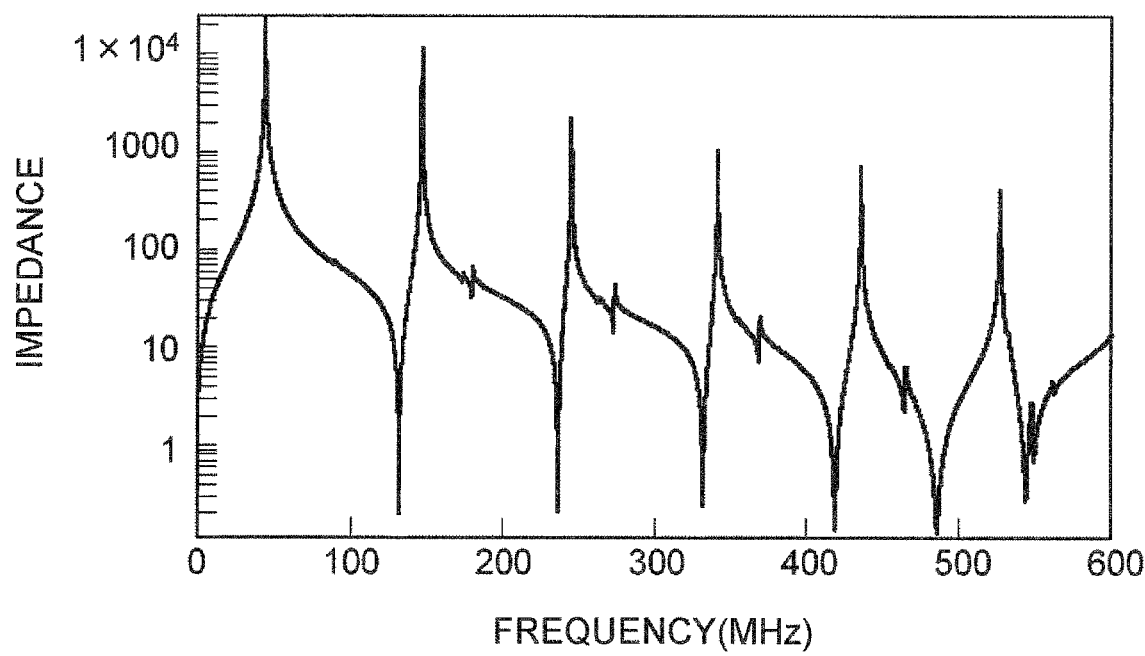
FIGS. 18A and 18B are views illustrating frequency characteristics of combined impedance calculated in the seventeenth and eighteenth simulations, respectively.
Figure 18B:
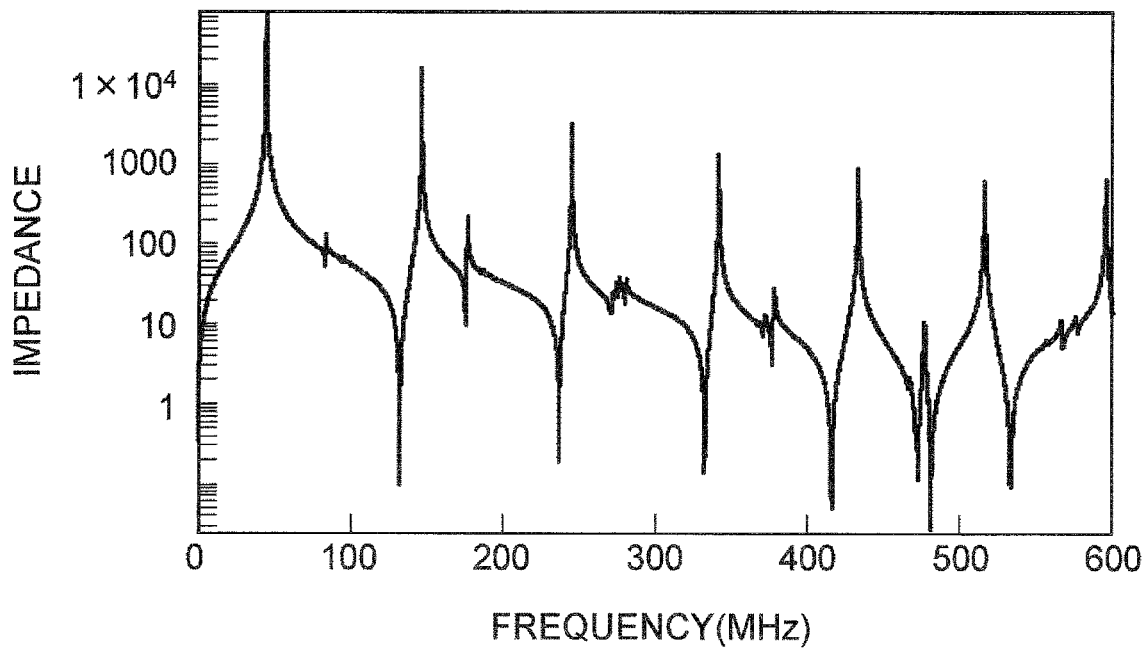

FIG. 16 is a view for explaining an arrangement of extension lines used for fourteenth to eighteenth simulations. In the fourteenth to eighteenth simulations, frequency characteristics of combined impedance of the plurality of filters FT having the plurality of coils 60 of the coil assembly CA illustrated in FIGS. 4 to 6 were calculated. The coil assembly CA was set to be disposed in the cylindrical frame 64 set to electric ground potential. In the fourteenth to eighteenth simulations, the angular ranges θ within which the extension lines 60a of the plurality of coils 60 were disposed were set to 360 degrees, 270 degrees, 180 degrees, 90 degrees, and 45 degrees, respectively.

Hereinafter, detailed settings of the fourteenth to eighteenth simulations will be described.

<Common Setting of Fourteenth to Eighteenth Simulations>

Coil length of each coil 60 of coil group CG1: 152 mm

Shape of each coil 60 of coil group CG1: straight angle shape of 3 mm×0.8 mm

Inner diameter of each coil 60 of coil group CG1: 51 mm

Pitch between turns of each coil 60 of coil group CG1: 16 mm

Distance of gap between turns adjacent to each other in axial direction of coil group CG1: 2 mm Capacitance of capacitor connected to each coil 60 of coil group CG1: 5600 pF Coil length of each coil 60 of coil group CG2: 152 mm Shape of each coil 60 of coil group CG2: straight angle shape of 3 mm×0.8 mm Inner diameter of each coil 60 of coil group CG2: 60 mm Pitch between turns of each coil 60 of coil group CG2: 18.5 mm Distance of gap between turns adjacent to each other in axial direction of coil group CG2: 5.5 mm Capacitance of capacitor connected to each coil 60 of coil group CG2: 5600 pF Coil length of each coil 60 of coil group CG3: 152 mm Shape of each coil 60 of coil group CG3: straight angle shape of 3 mm×0.8 mm Inner diameter of each coil 60 of coil group CG3: 69 mm Pitch between turns of each coil 60 of coil group CG3: 21 mm Distance of gap between turns adjacent to each other in axial direction of coil group CG3: 12 mm Distance in radial direction between outer circumferential surface of each coil 60 of coil group CG3 and frame 64: 13 mm Capacitance of capacitor connected to each coil 60 of coil group CG3: 5600 pF Frequency characteristics of combined impedance calculated in the fourteenth to eighteenth simulations are illustrated in FIGS. 17A, 17B, 17C, 18A, and 18B, respectively. In FIGS. 17A, 17B, 17C, 18A, and 18B, horizontal axes indicate frequencies, and vertical axes indicate combined impedance. As illustrated in FIGS. 17A, 17B, 17C, 18A, and 18B, the regularity of peak frequencies was maintained comparatively well in the frequency characteristics of the combined impedance calculated in the fifteenth to seventeenth simulations in comparison with the frequency characteristics of the combined impedance calculated in the fourteenth and eighteenth simulations. Therefore, it was ascertained that a difference in frequency characteristics of impedance between the plurality of filters was further decreased when the extension lines 60a of the plurality of coils 60 were uniformly arranged within an angular range of 90 degrees or more to 270 degrees or less about the central axis AXC.

[Nineteenth to Twenty-Third Simulations]

Figure 19:
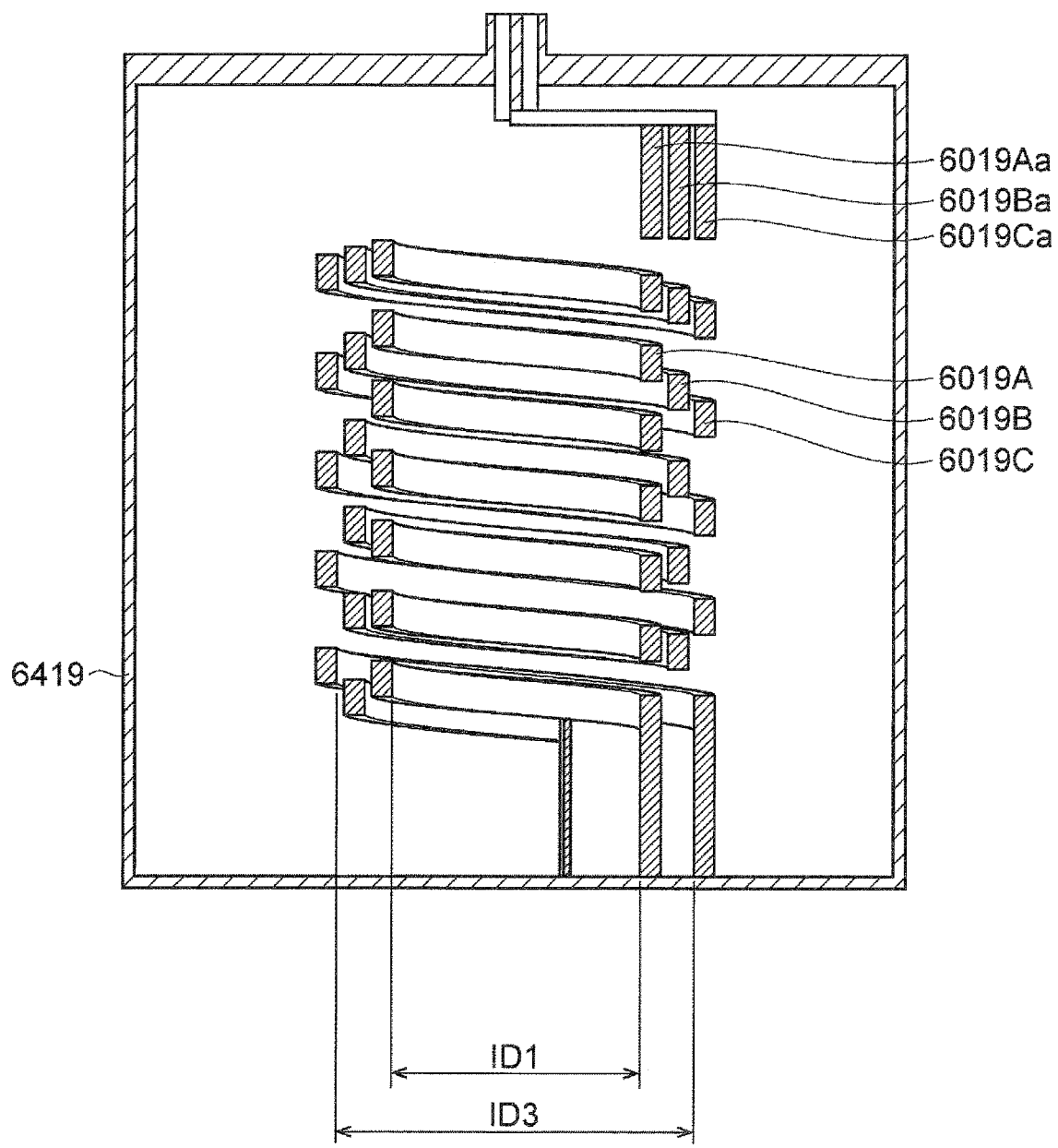
FIG. 19 is a cross-sectional view for explaining a plurality of coils used for nineteenth to twenty-third simulations.
Figure 20A:
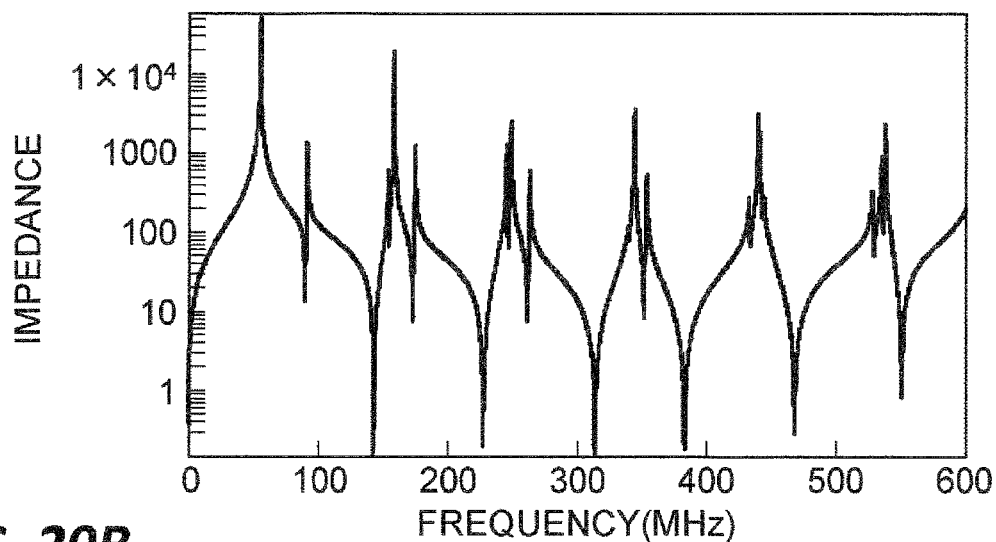
FIGS. 20A, 20B, and 20C are views illustrating frequency characteristics of combined impedance calculated in the nineteenth to twenty-first simulations, respectively.
Figure 20B:
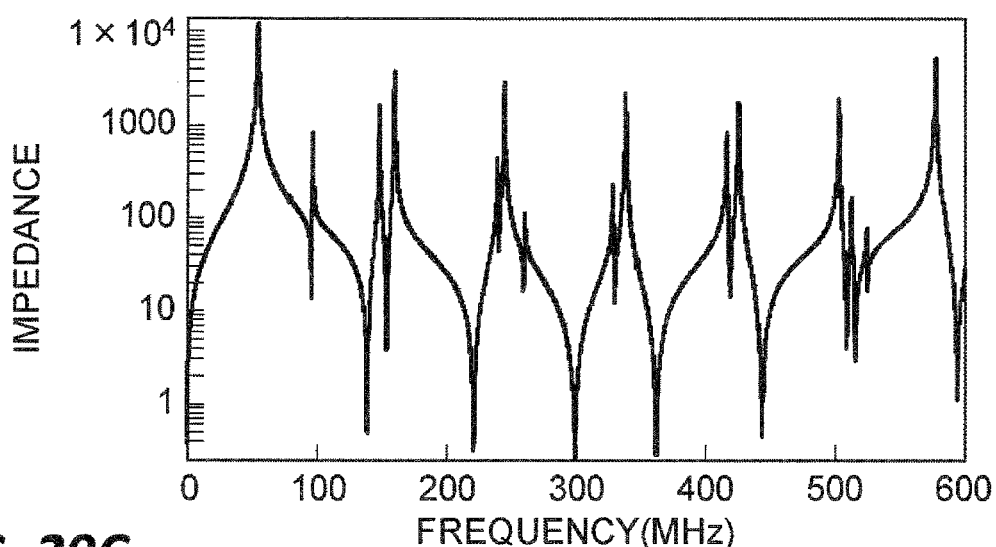
Figure 20C:
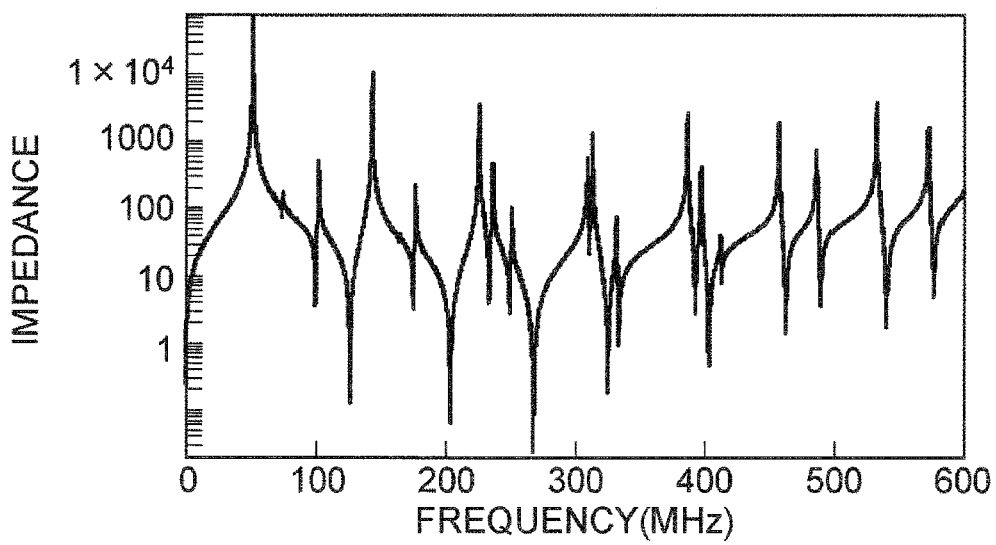
Figure 21A:
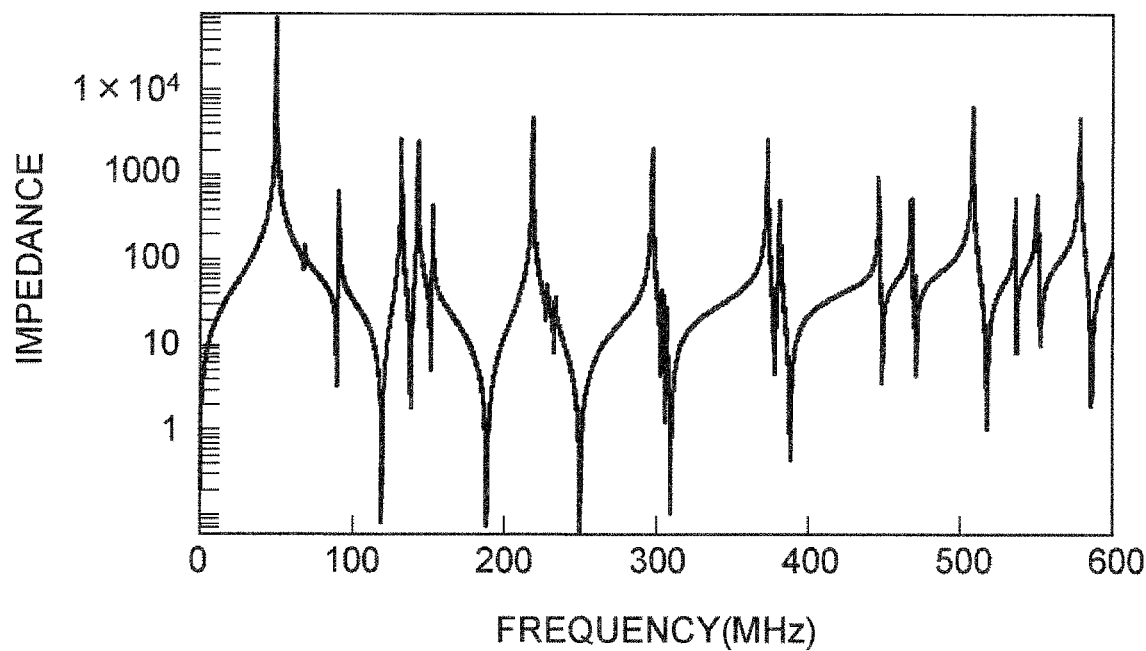
FIGS. 21A and 21B are views illustrating frequency characteristics of combined impedance calculated in the twenty-second and twenty-third simulations, respectively.
Figure 21B:
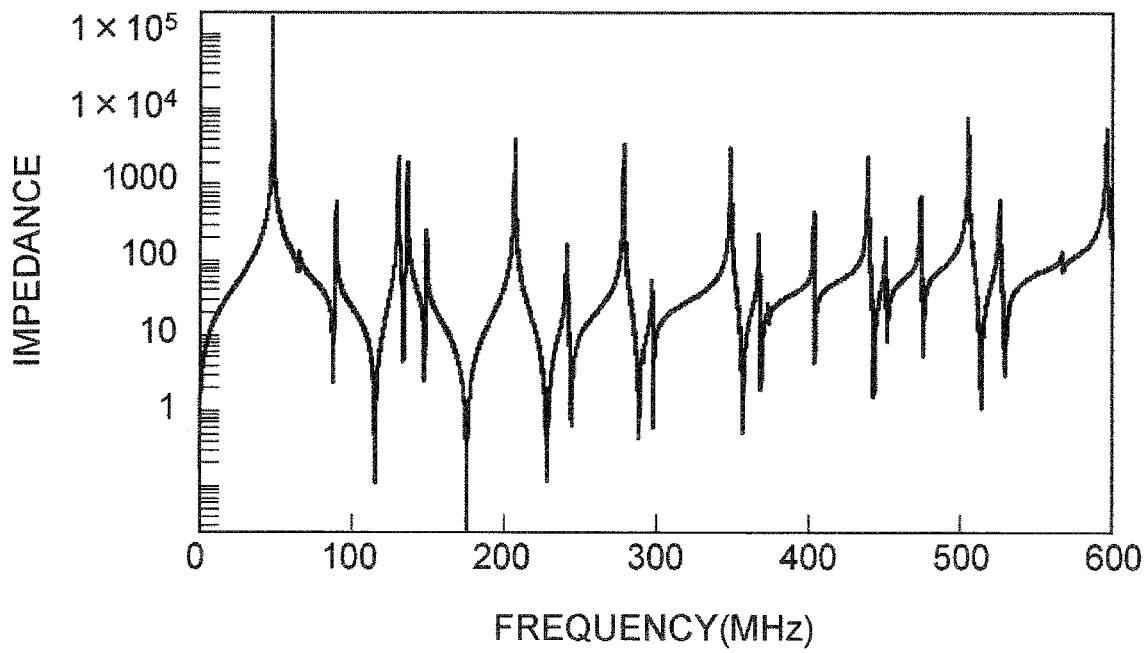

FIG. 19 is a cross-sectional view for explaining a plurality of coils used for nineteenth to twenty-third simulations. In the nineteenth to twenty-third simulations, frequency characteristics of combined impedance of three filters each having three coils 6019A, 6019B, and 6019C were calculated. Windings of the three coils 6019A, 6019B, and 6019C were set to have different inner diameters and to extend coaxially and spirally about a common central axis. The three coils 6019A, 6019B, and 6019C were set to be disposed in a cylindrical frame 6419 set to electric ground potential. Extension lines 6019Aa, 6019Ba, and 6019Ca at one end side of the three coils 6019A, 6019B, and 6019C were set to be coupled to one another. In addition, in the nineteenth to twenty-third simulations, three capacitors were set to be connected between the other ends of the three coils 6019A, 6019B, and 6019C and the ground, respectively. In the nineteenth to twenty-third simulations, inner diameters ID3 of the coils 6019C were set to be 1.23, 1.48, 1.83, 2.2, and 2.56 times an inner diameter ID1 of the coil 6019A, respectively.

Hereinafter, detailed settings of the nineteenth to twenty-third simulations will be described.

<Common Setting of Nineteenth to Twenty-Third Simulations>
Coil length of coil 6019A: 122 mm
Inner diameter of winding of coil 6019A: 65 mm
Pitch between turns of winding of coil 6019A: 17.5 mm
Capacitance of capacitor connected to coil 6019A: 5600 pF
Coil length of coil 6019B: 122 mm
Capacitance of capacitor connected to coil 6019B: 5600 pF
Coil length of coil 6019C: 122 mm
Distance in radial direction between outer circumferential surface of coil 6019C and frame 6419: 13 mm
Capacitance of capacitor connected to coil 6019C: 5600 pF <Setting of Nineteenth Simulation>
Shape of winding of coil 6019A: straight angle shape of 3 mm×9 mm
Shape of winding of coil 6019B: straight angle shape of 3 mm×9 mm
Inner diameter of winding of coil 6019B: 74 mm
Pitch between turns of winding of coil 6019B: 20 mm
Shape of winding of coil 6019C: straight angle shape of 3 mm×9 mm
Inner diameter of winding of coil 6019C: 83 mm
Pitch between turns of winding of coil 6019C: 22 mm <Setting of Twentieth Simulation>
Shape of winding of coil 6019A: straight angle shape of 6 mm×9 mm
Shape of winding of coil 6019B: straight angle shape of 6 mm×9 mm
Inner diameter of winding of coil 6019B: 80 mm
Pitch between turns of winding of coil 6019B: 21.1 mm
Shape of winding of coil 6019C: straight angle shape of 6 mm×9 mm
Inner diameter of winding of coil 6019C: 95 mm
Pitch between turns of winding of coil 6019C: 24.5 mm <Setting of Twenty-First Simulation>
Shape of winding of coil 6019A: straight angle shape of 12 mm×9 mm
Shape of winding of coil 6019B: straight angle shape of 12 mm×9 mm
Inner diameter of winding of coil 6019B: 92 mm
Pitch between turns of winding of coil 6019B: 23.9 mm
Shape of winding of coil 6019C: straight angle shape of 12 mm×9 mm
Inner diameter of winding of coil 6019C: 119 mm
Pitch between turns of winding of coil 6019C: 29.8 mm <Setting of Twenty-Second Simulation>
Shape of winding of coil 6019A: straight angle shape of 18 mm×9 mm
Shape of winding of coil 6019B: straight angle shape of 18 mm×9 mm
Inner diameter of winding of coil 6019B: 104 mm
Pitch between turns of winding of coil 6019B: 26.6 mm
Shape of winding of coil 6019C: straight angle shape of 18 mm×9 mm
Inner diameter of winding of coil 6019C: 143 mm
Pitch between turns of winding of coil 6019C: 34.7 mm <Setting of Twenty-Third Simulation>
Shape of winding of coil 6019A: straight angle shape of 24 mm×9 mm
Shape of winding of coil 6019B: straight angle shape of 24 mm×9 mm
Inner diameter of winding of coil 6019B: 116 mm
Pitch between turns of winding of coil 6019B: 29.2 mm
Shape of winding of coil 6019C: straight angle shape of 24 mm×9 mm
Inner diameter of winding of coil 6019C: 167 mm
Pitch between turns of winding of coil 6019C: 39.3 mm Frequency characteristics of combined impedance calculated in the nineteenth to twenty-third simulations are illustrated in FIGS. 20A, 20B, 20C, 21A, and 21B, respectively. In FIGS. 20A, 20B, 20C, 21A, and 21B, horizontal axes indicate frequencies, and vertical axes indicate combined impedance. As illustrated in FIGS. 20A, 20B, 20C, 21A, and 21B, the regularity of peak frequencies was maintained comparatively well in the frequency characteristics of the combined impedance calculated in the nineteenth to twenty-first simulations in comparison with the frequency characteristics of the combined impedance calculated in the twenty-second and twenty-third simulations. According to the result, it was ascertained that a difference in frequency characteristics of impedance between the plurality of filters was further decreased when the inner diameter of the coil provided at the outermost side among the plurality of coils, which had different inner diameters and were provided coaxially, was equal to or less than 1.83 times the inner diameter of the coil provided at the innermost side among the plurality of coils. Therefore, it was ascertained that a difference in frequency characteristics of impedance between the plurality of filters was further decreased when the inner diameter of the two or more coils of the coil group provided at the outermost side among the plurality of coil groups was equal to or less than 1.83 times the inner diameter of the two or more coils of the coil group provided at the innermost side among the plurality of coil groups.

[Twenty-Fourth to Twenty-Seventh Simulations]

Figure 22:
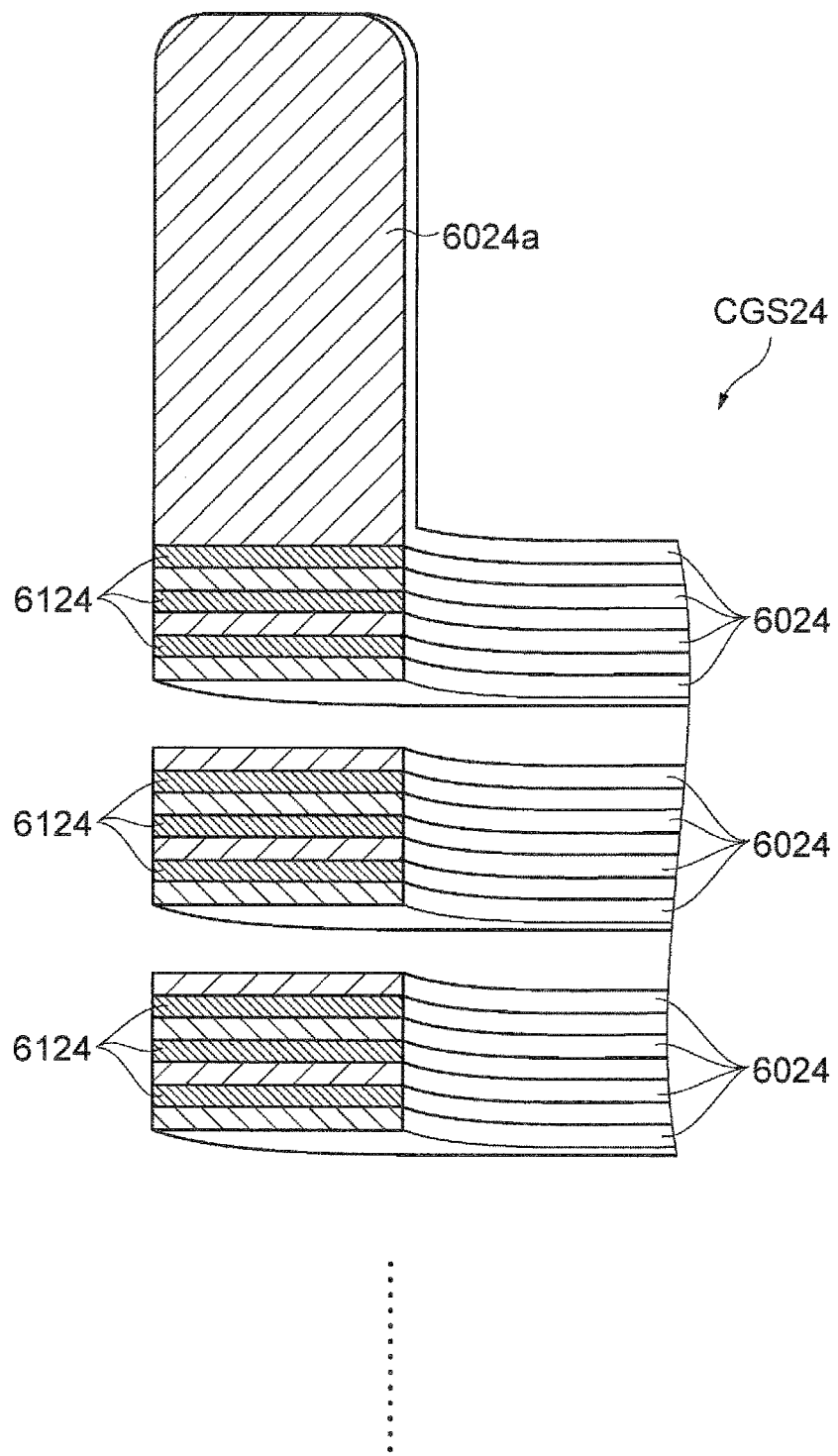
FIG. 22 is a view for explaining a coil group used for twenty-fourth to twenty-seventh simulations.

FIG. 22 is a view for explaining a coil group used for twenty-fourth to twenty-seventh simulations. In the twenty-fourth to twenty-seventh simulations, frequency characteristics of combined impedance of four filters each having four coils 6024 were calculated. In the twenty-fourth to twenty-seventh simulations, the four coils 6024 were set to constitute a single coil group CGS24 and extend similar to the two or more coils 60 of each of the plurality of coil groups CG. The four coils 6024 were set to be disposed in a cylindrical frame set to electric ground potential. Extension lines 6024a at one end side of the four coils 6024 were set to be coupled to one another. In addition, in the twenty-fourth to twenty-seventh simulations, four capacitors were set to be connected between the other ends of the four coils 6024 and the ground, respectively. In the twenty-fourth simulation, a distance of a gap between the adjacent turns in the axial direction Z was zero. In the twenty-fifth to twenty-seventh simulations, an insulator 6124 made of PEEK was set to be disposed between the adjacent turns in the axial direction Z. In the twenty-fifth to twenty-seventh simulations, thicknesses of the insulators 6124 in the axial direction Z were 0.2 mm, 0.5 mm, and 1 mm, respectively.

Hereinafter, detailed settings of the twenty-fourth to twenty-seventh simulations will be described.

<Common Setting of Twenty-Fourth to Twenty-Seventh Simulations>

Number of turns of each coil 6024: 14.25 turns

Shape of winding of each coil 6024: straight angle shape of 10 mm×1 mm

Inner diameter of winding of each coil 6024: 114 mm

Pitch between turns of winding of each coil 6024: 8 mm

Figure 23A:
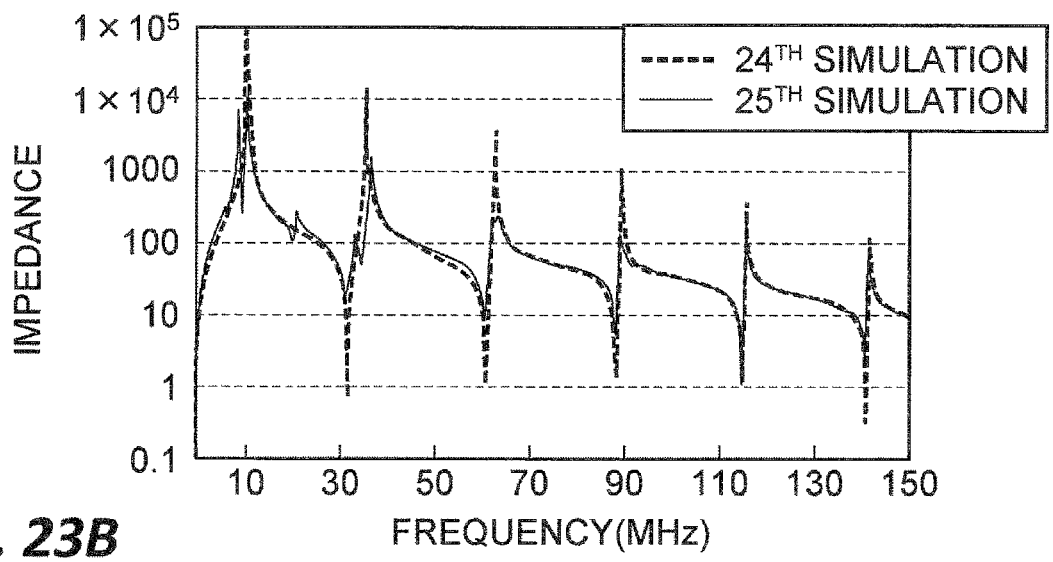
FIG. 23A is a view illustrating frequency characteristics of combined impedance calculated in the twenty-fourth and twenty-fifth simulations.
Figure 23B:
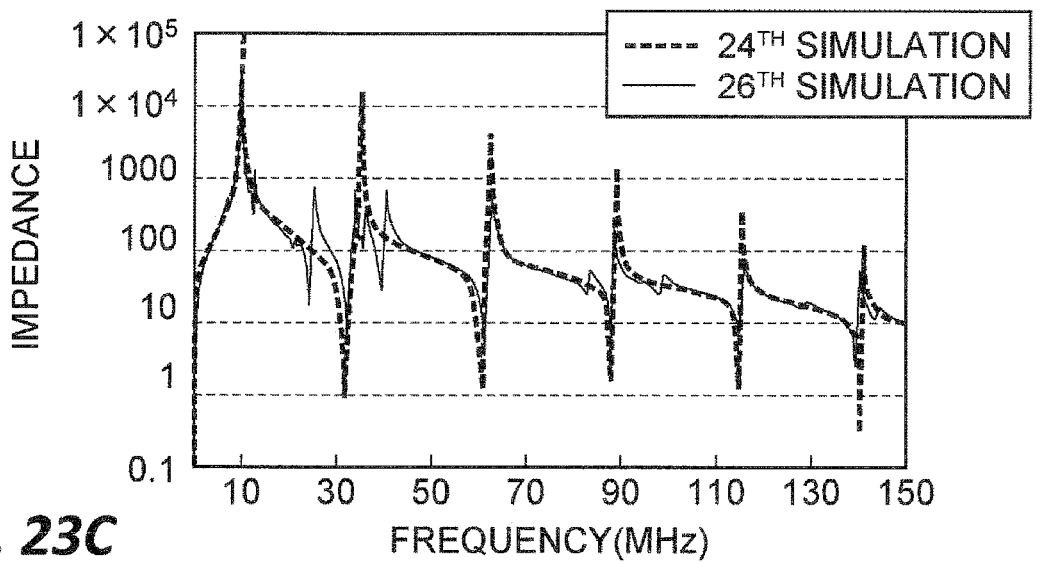
FIG. 23B is a view illustrating frequency characteristics of combined impedance calculated in the twenty-fourth and twenty-sixth simulations.
Figure 23C:
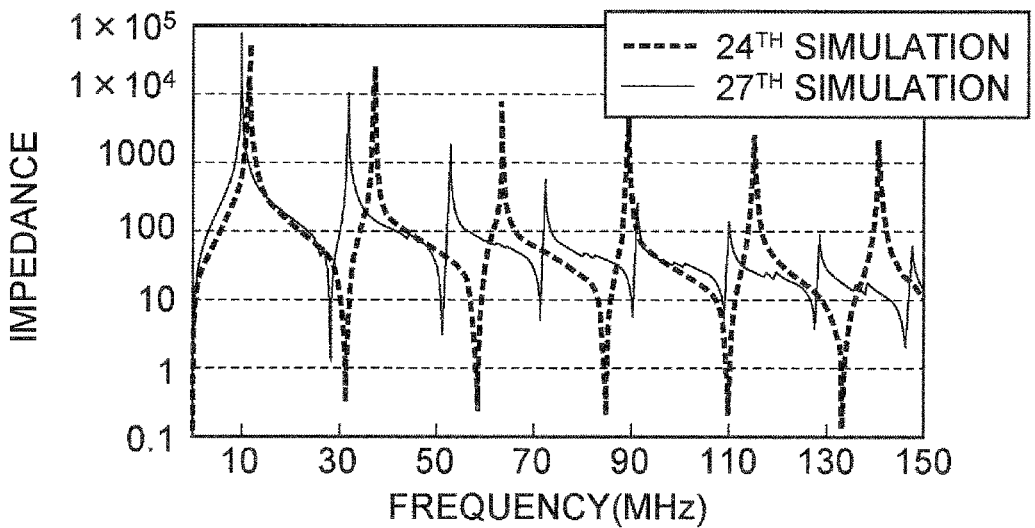
FIG. 23C is a view illustrating frequency characteristics of combined impedance calculated in the twenty-fourth and twenty-seventh simulations.

Distance in radial direction between outer circumferential surface of each coil 6024 and frame: 13 mm Capacitance of capacitor connected to each coil 6024: 5600 pF FIG. 23A illustrates frequency characteristics of combined impedance calculated in the twenty-fourth and twenty-fifth simulations, FIG. 23B illustrates frequency characteristics of combined impedance calculated in the twenty-fourth and twenty-sixth simulations, and FIG. 23C illustrates frequency characteristics of combined impedance calculated in the twenty-fourth and twenty-seventh simulations. In each of FIGS. 23A, 23B, and 23C, a horizontal axis indicates a frequency, and a vertical axis indicates combined impedance. As illustrated in FIGS. 23A, 23B, and 23C, the frequency characteristics of the combined impedance calculated in the twenty-fourth simulation approximately coincided with the frequency characteristics of the combined impedance calculated in the twenty-fifth simulation, and greatly differed from the frequency characteristics of the combined impedance calculated in the twenty-sixth and twenty-seventh simulations. Therefore, it was ascertained that a difference in frequency characteristics of impedance between the plurality of filters was decreased when a film thickness of the film of the plurality of coils was equal to or less than a half of 0.2 mm, that is, 0.1 mm or less.

While the various exemplary embodiments have been described above, various modified aspects may be made without being limited to the aforementioned exemplary embodiments. For example, the plasma processing apparatus having the filter device FD is not limited to the capacitively coupled plasma processing apparatus. The filter device FD may be used for any plasma processing apparatus such as an inductively coupled plasma processing apparatus and a plasma processing apparatus using surface waves such as microwaves.

The use of the filter device FD is not limited to the plasma processing apparatus. The filter device FD may be used for any purpose of blocking or attenuating high-frequency waves by using a plurality of filters.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A filter device comprising:
 a plurality of coils;
 a plurality of capacitors connected between the plurality of coils and ground; and
 a frame electrically grounded and accommodating therein the plurality of coils,
 wherein the plurality of coils constitute a plurality of coil groups each including two or more coils,
 the two or more coils in each of the plurality of coil groups are provided such that respective windings of the two or more coils within one of the plurality of coil groups extend spirally about and equidistantly from a single central axis, and respective turns of the two or more coils are sequentially stacked and repeatedly arranged in an axial direction in which the single central axis extends,
 the plurality of coil groups are provided coaxially with the single central axis, and
 a pitch between the respective turns of the two or more coils stacked in the axial direction of a second coil group from among the plurality of coil groups is larger than a pitch between the respective turns of the two or more coils stacked in the axial direction of a first coil group from among the plurality of coil groups, the first coil group having an outer diameter smaller than an inner diameter of the second coil group and being provided radially inside the second coil group to share the single central axis when viewed from above.

2. The filter device of claim 1, wherein pitches between turns of the plurality of coils are set such that the plurality of coils have substantially same inductances.

3. The filter device of claim 1, wherein the plurality of coils have substantially same coil lengths.

4. The filter device of claim 3, wherein a difference in coil length between a coil having a maximum coil length and a coil having a minimum coil length among the plurality of coils is 3% or less of the minimum coil length.

5. The filter device of claim 3, wherein windings of the plurality of coils have one ends and remaining ends at a side of the plurality of capacitors, respectively, and the one ends of the windings of the plurality of coils are provided along a plane orthogonal to the single central axis.

6. The filter device of claim 5, wherein the plurality of coils have extension lines which extend in the axial direction from the one ends of the windings of the plurality of coils, and the extension lines of the two or more coils in each of the plurality of coil groups are disposed at equal intervals in a circumferential direction about the single central axis.

7. The filter device of claim 6, wherein the extension lines of the plurality of coils are provided in an angular range having an angle of 90° or more and 270° or less about the single central axis.

8. The filter device of claim 1, wherein a distance in a radial direction of a gap between any two coil groups, which are adjacent to each other in the radial direction among the plurality of coil groups, is 1.5 mm or less.

9. The filter device of claim 1, wherein an inner diameter of the two or more coils of the coil group provided at an outermost side among the plurality of coil groups is equal to or less than 1.83 times an inner diameter of the two or more coils of the coil group provided at an innermost side among the plurality of coil groups.

10. A plasma processing apparatus comprising:
 a chamber main body;
 a stage provided in the chamber main body and having a lower electrode and a plurality of heaters;
 a high-frequency power source electrically connected to the lower electrode;
 a heater controller configured to provide electric power to the plurality of heaters; and
 the filter device of claim 1,
 wherein each of the plurality of coils of the filter device is electrically connected between the heater controller and a corresponding heater among the plurality of heaters.

11. The filter device of claim 1, wherein every coil within a respective coil group from among the plurality of coil groups has a same inner diameter.

12. The filter device of claim 1, wherein the outer diameter of the first coil group is separated from the inner diameter of the second coil group by a gap.

13. The filter device of claim 12, wherein the gap is 1.5 mm or less.

14. The filter device of claim 1, further comprising a third coil group from among the plurality of coil groups, the third coil group having an inner diameter larger than an outer diameter of the second coil group and being provided radially outside the second coil group,
   wherein the first coil group, the second coil group, and the third coil group are coaxially arranged to share the single central axis when viewed from above.

15. The filter device of claim 14, wherein a pitch between respective turns of the two or more coils stacked in the axial direction of the third coil group is larger than a pitch between the respective turns of the two or more coils stacked in the axial direction of the second coil group.

* * * * *